United States Patent
Akiyama et al.

(10) Patent No.: US 12,400,868 B2
(45) Date of Patent: Aug. 26, 2025

(54) SUBSTRATE PROCESSING METHOD AND SUBSTRATE PROCESSING APPARATUS

(71) Applicant: SCREEN Holdings Co., Ltd., Kyoto (JP)

(72) Inventors: Takashi Akiyama, Kyoto (JP); Tomohiro Takahashi, Kyoto (JP); Mitsutoshi Sasaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 591 days.

(21) Appl. No.: 17/746,043

(22) Filed: May 17, 2022

(65) Prior Publication Data

US 2022/0367203 A1    Nov. 17, 2022

(30) Foreign Application Priority Data

May 17, 2021    (JP) .................................. 2021-083202

(51) Int. Cl.
| | |
|---|---|
| *H01L 21/311* | (2006.01) |
| *H01L 21/306* | (2006.01) |
| *H01L 21/3213* | (2006.01) |
| *H01L 21/67* | (2006.01) |

(52) U.S. Cl.
CPC .. *H01L 21/31111* (2013.01); *H01L 21/30604* (2013.01); *H01L 21/32134* (2013.01); *H01L 21/67075* (2013.01); *H01L 21/67086* (2013.01); *H01L 21/67253* (2013.01)

(58) Field of Classification Search
CPC .............................................. H01L 21/00–86
See application file for complete search history.

(56) References Cited

U.S. PATENT DOCUMENTS

| | | | |
|---|---|---|---|
| 11,075,096 B2 | 7/2021 | Inada et al. | |
| 11,164,750 B2 | 11/2021 | Takahashi et al. | |
| 2018/0096855 A1 | 4/2018 | Sato | |
| 2019/0122905 A1 | 4/2019 | Ohno et al. | |
| 2019/0122906 A1 | 4/2019 | Zhang et al. | |
| 2019/0371595 A1* | 12/2019 | Honda | |
| 2020/0098598 A1 | 3/2020 | Takahashi et al. | |

(Continued)

FOREIGN PATENT DOCUMENTS

| | | |
|---|---|---|
| JP | 2011-199013 A | 10/2011 |
| JP | 2018-060896 A | 4/2018 |
| JP | 2019-212652 A | 12/2019 |

(Continued)

OTHER PUBLICATIONS

Office Action dated Feb. 15, 2023 for corresponding Taiwanese Patent Application No. 111117673.

*Primary Examiner* — Joshua L Allen
*Assistant Examiner* — Andrew Keelan Laobak
(74) *Attorney, Agent, or Firm* — OSTROLENK FABER LLP

(57) ABSTRACT

A substrate processing method is a method of performing an etching process on a substrate with an etching solution in a processing tank. The substrate includes silicon oxide films and silicon nitride films stacked alternately. The etching solution contains phosphoric acid. The substrate processing method includes immersing the substrate in the etching solution, and replenishing the etching solution in the processing tank with phosphoric acid during the etching process on the substrate to cause a silicon concentration in the etching solution to vary.

12 Claims, 14 Drawing Sheets

(56) References Cited

U.S. PATENT DOCUMENTS

2020/0152489 A1    5/2020   Inada et al.
2020/0312682 A1   10/2020   Yoshida

FOREIGN PATENT DOCUMENTS

| JP | A 2020-047886 | 3/2020 |
| JP | 2020-088312 A | 6/2020 |
| JP | 2021-002692 A | 1/2021 |
| JP | A 2022-045866 | 3/2022 |
| KR | 10-2019-0044008 A | 4/2019 |
| KR | 10-2020-0115316 A | 10/2020 |
| TW | 202013492 A | 4/2020 |
| TW | 202036710 A | 10/2020 |

* cited by examiner

SUBSTRATE PROCESSING METHOD AND SUBSTRATE PROCESSING APPARATUS

INCORPORATION BY REFERENCE

The present application claims priority under 35 U.S.C. § 119 to Japanese Patent Application No. 2021-083202, filed on May 17, 2021. The contents of this application are incorporated herein by reference in their entirety.

BACKGROUND

The subject matter of the present application relates to a substrate processing method and a substrate processing apparatus.

There is known a substrate processing apparatus that performs an etching process on a substrate having a multi-layer structure in which silicon oxide films and silicon nitride films are alternately stacked. As this kind of substrate processing apparatus, there is a batch type substrate processing apparatus for etching a substrate with etchant containing phosphoric acid. This type of the substrate processing apparatus selectively etches, of silicon oxide films and silicon nitride films, mainly the silicon nitride films, thereby removing the silicon nitride films.

SUMMARY

A substrate processing apparatus that selectively etches mainly silicon nitride films is used for a process by which an etched multilayer structure becomes a structure in which a plurality of flat silicon oxide films are arranged in a comb shape, because the substrate processing apparatus does not substantially etch the silicon oxide films. It is however required to process a substrate into a more complicated shape due to miniaturization and high integration of semiconductor devices.

A substrate processing method according to an aspect of the present disclosure is a method of performing an etching process on a substrate with an etching solution in a processing tank. The substrate includes silicon oxide films and silicon nitride films stacked alternately. The etching solution contains phosphoric acid. The substrate processing method includes immersing the substrate in the etching solution, and replenishing the etching solution in the processing tank with phosphoric acid during the etching process on the substrate to cause a silicon concentration in the etching solution to vary.

In an embodiment, in the replenishing, a replenishment flow rate of the phosphoric acid that the etching solution is replenished with is controlled based on a set value for a replenishment flow rate of phosphoric acid that is set according to a structure of a semiconductor device to be manufactured using the substrate.

In an embodiment, in the replenishing, a replenishment flow rate of the phosphoric acid that the etching solution is replenished with is controlled based a silicon concentration in the etching solution. The silicon concentration is measured during the etching process on the substrate.

In an embodiment, in the replenishing, the phosphoric acid that the etching solution is replenished with is supplied with a silicon containing liquid. The silicon containing liquid is a liquid that contains silicon.

In an embodiment, in the replenishing, a supply flow rate of the silicon containing liquid to be supplied to the phosphoric acid is controlled based on a set value for a supply flow rate of a silicon containing liquid that is set according to a structure of a semiconductor device to be manufactured using the substrate.

In an embodiment, in the replenishing, a supply flow rate of the silicon containing liquid to be supplied to the phosphoric acid is controlled based on a silicon concentration in the etching solution measured during the etching process on the substrate.

In an embodiment, the structure of the semiconductor device indicates size of a gap between the silicon oxide films adjacent to each other in a stacking direction in the semiconductor device.

A substrate processing apparatus according to another aspect of the present disclosure performs an etching process on a substrate with an etching solution. The substrate includes silicon oxide films and silicon nitride films stacked alternately. The etching solution contains phosphoric acid. The substrate processing apparatus includes a processing tank, a substrate holding section, a phosphoric acid replenishment mechanism, and a controller. The processing tank stores the etching solution. The substrate holding section holds the substrate in the etching solution stored in the processing tank. The phosphoric acid replenishment mechanism replenishes the etching solution in the processing tank with phosphoric acid. The controller controls the phosphoric acid replenishment mechanism during the etching process on the substrate to cause a silicon concentration in the etching solution to vary.

In an embodiment, the controller controls the phosphoric acid replenishment mechanism during the etching process on the substrate based on a set value for a replenishment flow rate of phosphoric acid that is set according to a structure of a semiconductor device to be manufactured using the substrate.

In an embodiment, the substrate processing apparatus further includes a silicon concentration measuring device that measures a silicon concentration in the etching solution. The controller controls the phosphoric acid replenishment mechanism during the etching process on the substrate based on a silicon concentration measured through the silicon concentration measuring device during the etching process on the substrate.

In an embodiment, the substrate processing apparatus further includes a silicon supply mechanism. The silicon supply mechanism supplies a silicon containing liquid to the phosphoric acid that the etching solution is replenished with. The silicon containing liquid is a liquid that contains silicon.

In an embodiment, the controller controls the silicon supply mechanism during the etching process on the substrate based on a set value for a supply flow rate of a silicon containing liquid that is set according to a structure of a semiconductor device to be manufactured using the substrate.

In an embodiment, the substrate processing apparatus further includes a silicon concentration measuring device that measures a silicon concentration in the etching solution. The controller controls the silicon supply mechanism during the etching process on the substrate based on a silicon concentration measured through the silicon concentration measuring device during the etching process on the substrate.

In an embodiment, the structure of the semiconductor device indicates size of a gap between the silicon oxide films adjacent to each other in a stacking direction in the semiconductor device.

DETAILED DESCRIPTION

Figure 1A:
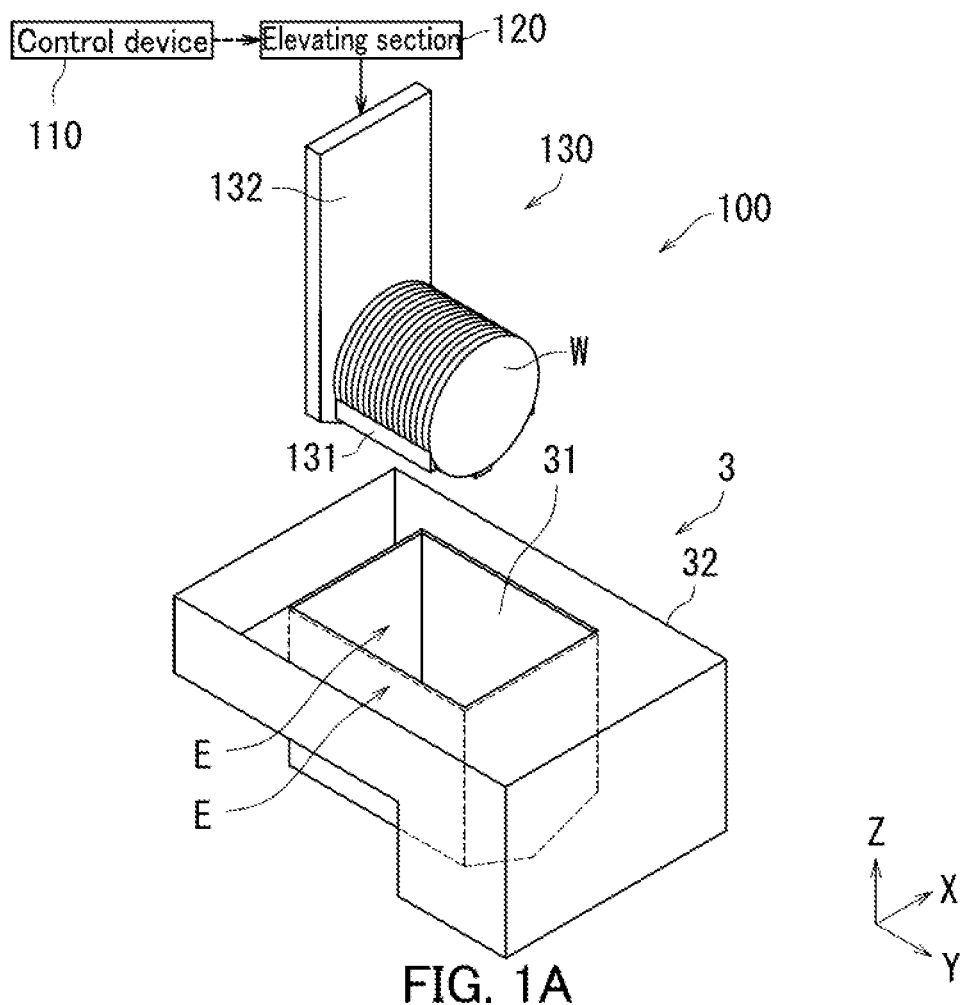
FIGS. 1A and 1B illustrate a substrate processing apparatus according to a first embodiment.

Hereinafter, embodiments of a substrate processing method and a substrate processing apparatus according to the subject matter of the present application will be described with reference to the drawings (FIGS. 1A to 24). However, the subject matter of the present application is not limited to the following embodiments. Note that the duplicated description may be omitted as appropriate. In the drawings, elements which are the same or equivalent are labelled the same reference signs and description thereof is not repeated.

In the present specification, X-direction, Y-direction, and Z-direction orthogonal to each other may be described for ease of understanding. Typically, the X-direction and Y-direction are parallel to the horizontal direction and the Z-direction is parallel to the vertical direction. However, the definition of these directions does not intend to limit the orientation when the substrate processing method according to the present disclosure is executed and the orientation when the substrate processing apparatus according to the present disclosure is used.

Examples of a "substrate" in the embodiments include a semiconductor wafer, a glass substrate for a photomask, a glass substrate for a liquid crystal display, a glass substrate for a plasma display, a substrate for a field mission display (FED), a substrate for an optical disk, a substrate for a magnetic disk, and a substrate for a magneto-optical disk. Although the embodiments will hereinafter be described mainly by taking as an example a substrate processing method and a substrate processing apparatus used for processing a disk-shaped semiconductor wafer, the embodiments can be similarly applied to the various substrates exemplified above. Further, various shapes can be applied to the shape of the substrate.

First Embodiment

Hereinafter, a first embodiment will be described with reference to FIGS. 1A to 16. First, a substrate processing apparatus 100 according to the present embodiment will be described with reference to FIGS. 1A and 1B. The substrate processing apparatus 100 according to the present embodiment is a batch type etching apparatus. Therefore, the substrate processing apparatus 100 performs an etching process on a plurality of substrates W at once. For example, the substrate processing apparatus 100 performs an etching process on a plurality of substrates W for each lot unit. One lot consists of, for example 25 substrates W.

Figure 1B:
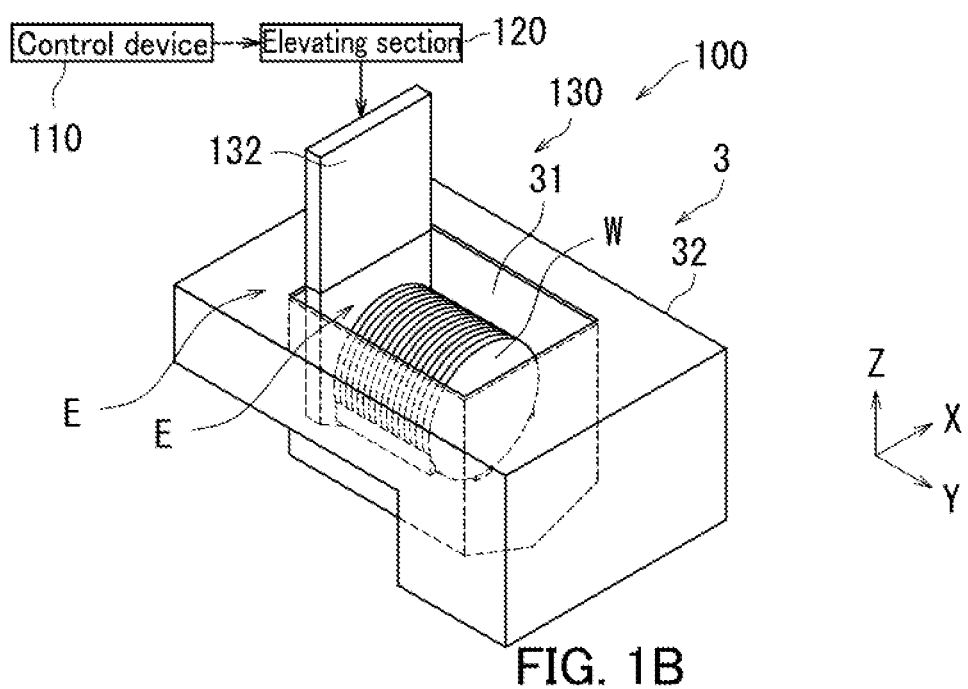

FIGS. 1A and 1B illustrate the substrate processing apparatus 100 according to the present embodiment. Specifically, FIG. 1A illustrates the substrate processing apparatus 100 before the substrates W are placed in a processing tank 3. FIG. 1B illustrates the substrate processing apparatus 100 after the substrates W are placed in the processing tank 3. As illustrated in FIGS. 1A and 1B, the substrate processing apparatus 100 includes the processing tank 3, a control device 110, an elevating section 120, and a substrate holding portion 130.

The processing tank 3 stores an etching solution E. The etching solution E contains phosphoric acid ($H_3PO_4$) and silicon. The etching solution E may further contain a diluting liquid. The diluting liquid is, for example deionized water (DIW). DIW is a kind of pure water. Examples of the diluting liquid include carbonated water, electrolytic ionized water, hydrogen water, ozone water, or hydrochloric acid water having a diluted concentration (for example, about 10 ppm to about 100 ppm). Note that the etching solution E may further contain an additive different from silicon. The processing tank 3 includes an inner tank 31 and an outer tank 32. The outer tank 32 surrounds the inner tank 31. In other words, the processing tank 3 has a double tank structure. Each of the inner tank 31 and the outer tank 32 has an upper opening that opens upward.

Each of the inner tank 31 and the outer tank 32 stores the etching solution E. The inner tank 31 allows the plurality of substrates W to be placed in. Specifically, the plurality of substrates W held by the substrate holding portion 130 are placed in the inner tank 31. The plurality of substrates W are placed in the inner tank 31, and consequently immersed in the etching solution E in the inner tank 31.

The substrate holding portion 130 holds the plurality of substrates W in the etching solution E in the processing tank 3 (inner tank 31). Specifically, the substrate holding portion 130 includes a plurality of holding rods 131 and a body plate 132. The body plate 132 is a plate-shaped member and extends in the vertical direction (Z-direction). The plurality of holding rods 131 extend in the horizontal direction (Y-direction) from one main surface of the body plate 132. In the present embodiment, the substrate holding portion 130 includes three holding rods 131 (see FIG. 2).

The plurality of substrates W are held by the plurality of holding rods 131. Specifically, the plurality of substrates W are held in an upright posture (vertical posture) by the plurality of holding rods 131 with the lower edges of the substrates W being in contact with the plurality of holding rods 131. The plurality of substrates W held by the substrate holding portion 130 are arranged at intervals in the Y-direction. That is, the plurality of substrates W are aligned in a row in the Y-direction. Each of the plurality of substrates W is also held by the substrate holding portion 130 in a posture substantially parallel to the XZ plane.

The control device 110 controls the operation of each section of the substrate processing apparatus 100. The control device 110 controls, for example the operation of the elevating section 120. The elevating section 120 is controlled by the control device 110 to lift the substrate holding section 130 up and down. The elevating section 120 lifts the substrate holding section 130 up and down, whereby the substrate holding section 130 moves vertically upward and vertically downward while holding the plurality of substrates W. The elevating section 120 includes a drive source and an elevating mechanism. The elevating mechanism is driven by the drive source to lift the substrate holding section 130 up and down. The drive source includes, for example a motor. The elevating mechanism includes, for example, a rack and pinion mechanism or a ball screw.

More specifically, the elevating section 120 lifts the substrate holding section 130 up and down between a processing position (position in FIG. 1B) and a retracted position (position in FIG. 1A). As illustrated in FIG. 1B, when the substrate holding section 130 moves vertically downward (Z-direction) while holding the plurality of substrates W and reaches the processing position, the plurality of substrates W are placed in the processing tank 3. That is, the plurality of substrates W held by the substrate holding section 130 move in the inner tank 31. As a result, the plurality of substrates W are immersed in the etching solution E in the inner tank 31, and an etching process is performed on the substrates W with the etching solution E. On the other hand, as illustrated in FIG. 1A, when the substrate holding section 130 moves to the retracted position, the plurality of substrates W held by the substrate holding section 130 move above the processing tank 3 to be pulled up from the etching solution E.

Figure 2:
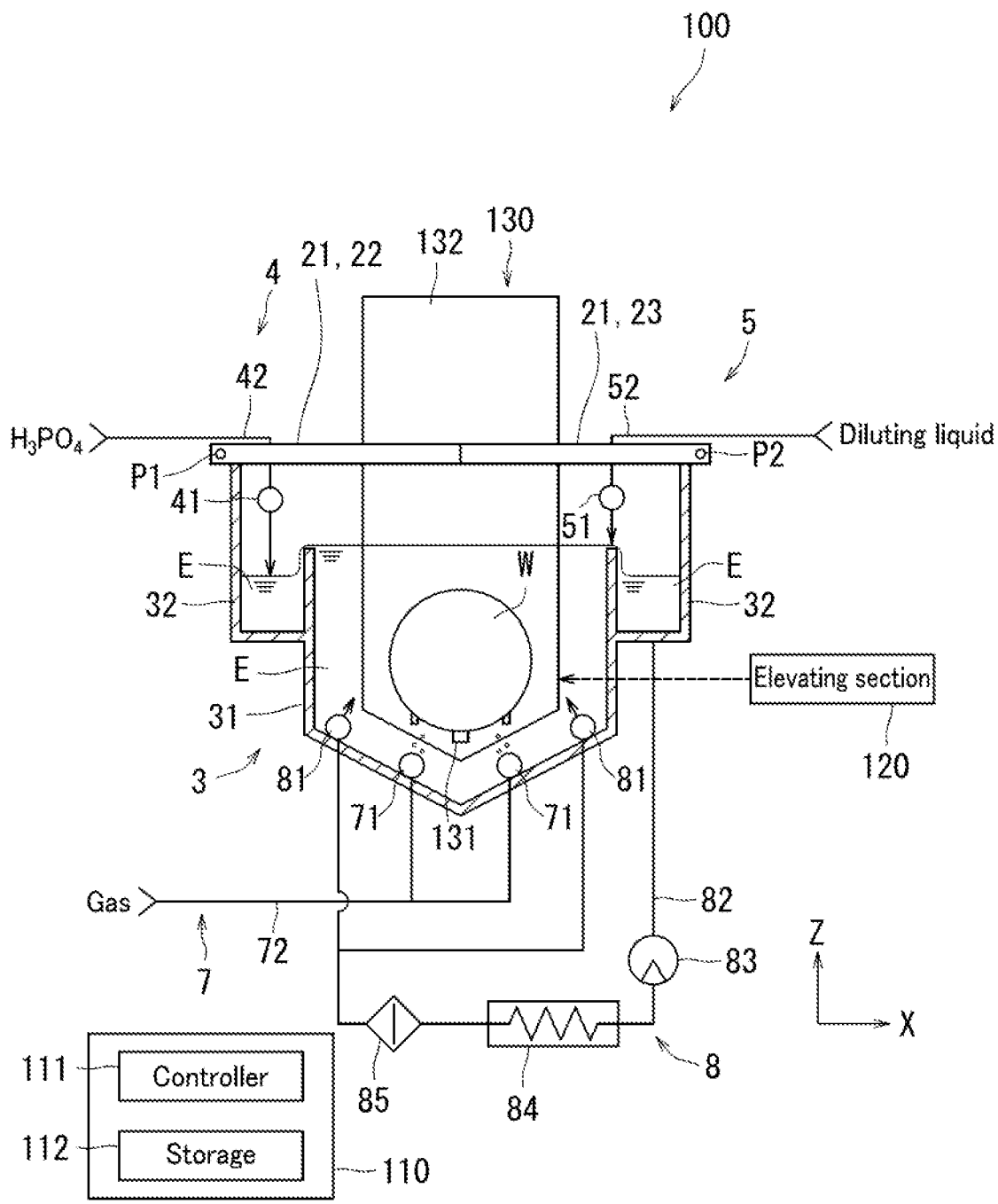
FIG. 2 is a cross-sectional view illustrating the configuration of the substrate processing apparatus according to the first embodiment.

The configuration of the substrate processing apparatus 100 according to the present embodiment will be then described with reference to FIG. 2. FIG. 2 is a cross-sectional view illustrating the configuration of the substrate processing apparatus 100 according to the present embodiment. As illustrated in FIG. 2, the control device 110 includes a controller 111 and storage 112.

The controller 111 may include a processor. Examples of the controller 111 include a central processing unit (CPU) and a micro processing unit (MPU). The controller 111 controls the operation of each section of the substrate processing apparatus 100 based on a computer program and data stored in the storage 112. Alternatively, the controller 111 may include a general-purpose arithmetic unit or a dedicated arithmetic unit. General-purpose arithmetic units and dedicated arithmetic units include integrated circuits. The integrated circuit constitutes a logic circuit.

The storage 112 stores the data and the computer program. The data includes recipe data. The recipe data indicates a plurality of recipes. Each of the plurality of recipes defines the processing content and processing procedure for the substrates W. The storage 112 includes main memory. The main memory is, for example semiconductor memory. Examples of the main memory include read-only memory (ROM) and random access memory (RAM). The storage 112 may further include an auxiliary storage device. Examples of the auxiliary storage device include semiconductor memory and a hard disk drive. The storage 112 may include removable media.

The configuration of the substrate processing apparatus 100 according to the present embodiment will be further described with reference to FIG. 2. As illustrated in FIG. 2, the substrate processing apparatus 100 further includes a phosphoric acid replenishment mechanism 4, a diluting liquid supply mechanism 5, a bubbling section 7, an etching solution circulating section 8, and an automatic cover 21.

The automatic cover 21 opens and closes the upper opening of the processing tank 3. Specifically, the automatic cover 21 opens and closes the upper opening of the inner tank 31 and the upper opening of the outer tank 32. In the present embodiment, the automatic cover 21 includes a first cover piece 22 and a second cover piece 23. The first cover piece 22 and the second cover piece 23 are free to open and close the upper opening of the processing tank 3. The first cover piece 22 and the second cover piece 23 open and close, whereby the automatic cover 21 opens and closes like hinged double doors.

Specifically, the first cover piece 22 is rotatable about a first rotation shaft P1. The first rotation axis P1 extends in the Y-direction. The first rotation shaft P1 supports the end portion of the first cover piece 22 on the opposite side to the center side of the automatic cover 21. The second cover piece 22 is rotatable about a second rotation shaft P2. The second rotation axis P2 extends in the Y-direction. The second rotation shaft P2 supports the end portion of the second cover piece 23 on the opposite side to the center side of the automatic cover 21.

The control device 110 (controller 111) brings the automatic cover 21 to an open state when making the substrate holding section 130 move from the retracted position (position in FIG. 1A) to the processing position (position in FIG. 1B). When the automatic cover 21 becomes in the open state, the upper opening of the processing tank 3 is opened, which allows the substrate W to be placed in the processing tank 3 (inner tank 31). The control device 110 (controller 111) brings the automatic cover 21 to a closed state during an etching process on the substrates W. When the automatic cover 21 is brought to the closed state, the upper opening of the processing tank 3 is closed. As a result, the inside of the processing tank 3 becomes a closed space.

The control device 110 (controller 111) brings the automatic cover 21 to an open state when making the substrate holding section 130 move from the processing position (position in FIG. 1B) to the retracted position (position in FIG. 1A). When the automatic cover 21 becomes in the open state, the upper opening of the processing tank 3 is opened, which allows the substrates W to be pulled up from the processing tank 3 (inner tank 31).

The phosphoric acid replenishment mechanism 4 will be then described with reference to FIG. 2. The phosphoric acid replenishment mechanism 4 replenishes the etching solution E in the processing tank 3 with phosphoric acid. In the present embodiment, the phosphoric acid with which is replenished by the phosphoric acid replenishment mechanism 4 is a new liquid. Therefore, the phosphoric acid with which is replenished by the phosphoric acid replenishment mechanism 4 contains no silicon.

The control device 110 (controller 111) controls the phosphoric acid replenishment mechanism 4 during an etching process on the substrates W so that the etching solution E in the processing tank 3 is replenished with phosphoric acid, thereby causing a silicon concentration C in the etching solution E to vary. Specifically, during the etching process on the substrates W, the controller 111 causes the silicon concentration C in the etching solution E to vary from a first silicon concentration C1 to a second silicon concentration C2. Here, the first silicon concentration C1 indicates the silicon concentration C at the start of the etching process. The second silicon concentration C2 may be a concentration different from the first silicon concentration C1. For example, the second silicon concentration C2 is larger than the first silicon concentration C1.

Specifically, when the substrates W are immersed in the etching solution E, the silicon nitride films Mb (see FIG. 7) included in each substrate W react with the phosphoric acid to be etched. At this time, silicon is produced as a reactant. The generated silicon dissolves in the etching solution E. Therefore, when the etching solution E is replenished with no phosphoric acid during the etching process on the substrates W, the silicon concentration C in the etching solution E increases at a constant rate until the silicon nitride films Mb are removed. On the other hand, in the present embodiment, the phosphoric acid replenishment mechanism 4 appropriately replenishes the etching solution E with phosphoric acid during the etching process on the substrates W, thereby controlling the silicon concentration C in the etching solution E.

In the present embodiment, the phosphoric acid replenishment mechanism 4 includes a phosphoric acid supply nozzle 41 and a phosphoric acid supply pipe 42. The phosphoric acid supply nozzle 41 directs the stream of phosphoric acid to the processing tank 3. The phosphoric acid supply pipe 42 allows the phosphoric acid to flow through to the phosphoric acid supply nozzle 41. The phosphoric acid supply nozzle 41 is an example of a phosphoric acid supply section.

More specifically, the phosphoric acid supply nozzle 41 is placed above the processing tank 3. The phosphoric acid supply nozzle 41 is a hollow tubular member. A plurality of ejecting holes are formed in the phosphoric acid supply nozzle 41. In the present embodiment, the phosphoric acid supply nozzle 41 extends in the Y-direction. The plurality of ejecting holes in the phosphoric acid supply nozzle 41 are formed at equal intervals in the Y-direction. When phosphoric acid is supplied to the phosphoric acid supply nozzle 41 via the phosphoric acid supply pipe 42, the phosphoric acid is ejected from the plurality of ejecting holes in the phosphoric acid supply nozzle 41 toward the processing tank 3. The processing tank 3 is consequently supplied with the phosphoric acid. In the present embodiment, the phosphoric acid supply nozzle 41 is placed above the outer tank 32. Therefore, phosphoric acid is ejected from the phosphoric acid supply nozzle 41 toward the outer tank 32, and supplied to the outer tank 32.

The diluting liquid supply mechanism 5 will be then described with reference to FIG. 2. The diluting liquid supply mechanism 5 supplies a diluting liquid to the processing tank 3. The diluting liquid is consequently supplied to the etching solution E in the processing tank 3. Specifically, the diluting liquid supply mechanism 5 includes a diluting liquid supply nozzle 51 and a diluting liquid supply pipe 52.

The diluting liquid supply nozzle 51 is placed above the processing tank 3. The diluting liquid supply nozzle 51 is a hollow tubular member. A plurality of ejecting holes are formed in the diluting liquid supply nozzle 51. In the present embodiment, the diluting liquid supply nozzle 51 extends in the Y-direction. The plurality of ejecting holes in the diluting liquid supply nozzle 51 are formed at equal intervals in the Y-direction.

The diluting liquid supply pipe 52 allows the diluting liquid to flow through to the diluting liquid supply nozzle 51. The diluting liquid is supplied to the diluting liquid supply nozzle 51 via the diluting liquid supply pipe 52, and then ejected from the plurality of ejecting holes in the diluting liquid supply nozzle 51.

The etching solution E is heated. The etching solution E has, for example a temperature in 120° C. or higher and 160° C. or lower. Therefore, the water contained in the etching solution E evaporates. A diluting liquid is appropriately supplied to the etching solution E to cause a concentration value or a specific gravity value of the phosphoric acid in the etching solution E to maintain a target value.

The bubbling section 7 will be then described with reference to FIG. 2. The bubbling section 7 supplies air bubbles toward the plurality of substrates W immersed in the etching solution E in the inner tank 31. Specifically, the bubbling section 7 includes a plurality of gas supply nozzles 71 and a gas supply pipe 72. Note that although the bubbling section 7 includes two gas supply nozzles 71 in the present embodiment, the bubbling section 7 may include one gas supply nozzle 71 or three or more gas supply nozzles 71.

The plurality of gas supply nozzles 71 are placed on the bottom side of the inner tank 31. More specifically, the plurality of gas supply nozzles 71 are arranged in the inner tank 31 in a location below the plurality of substrates W immersed in the etching solution E in the inner tank 31.

Each of the gas supply nozzles 71 is a hollow tubular member. A plurality of ejecting holes are formed in each of the gas supply nozzles 71. In the present embodiment, the gas supply nozzles 71 extend in the Y-direction. The plurality of ejecting holes in each gas supply nozzle 71 are formed at equal intervals in the Y-direction.

Gas is ejected from the ejecting holes in each of the gas supply nozzles 71, whereby air bubbles are supplied toward the plurality of substrates W immersed in the etching solution E in the inner tank 31. The gas is, for example an inert gas. Specifically, the gas may be nitrogen.

The gas supply pipe 72 allows the gas to flow through to the plurality of gas supply nozzles 71. The gas flows through the gas supply pipe 72, so that air bubbles are supplied toward the plurality of substrates W immersed in the etching solution E in the inner tank 31. As a result, the non-uniformity of the silicon concentration C in the etching solution E is suppressed, thereby enabling uniform etching on the substrates W.

The etching solution circulating section 8 will be then described with reference to FIG. 2. The etching solution circulating section 8 circulates the etching solution E between the outer tank 32 and the inner tank 31. Specifically, the etching solution circulating section 8 includes a plurality of etching solution supply nozzles 81, a circulation pipe 82, a circulation pump 83, a circulation heater 84, and a circulation filter 85. Note that although the etching solution circulating section 8 includes two etching solution supply nozzles 81 in the present embodiment, the etching solution circulating section 8 may include one or three or more etching solution supply nozzles 81.

The plurality of etching solution supply nozzles 81 are arranged on the bottom side of the inner tank 31. Each of the etching solution supply nozzles 81 is a hollow tubular member. A plurality of ejecting holes are formed in each of the etching solution supply nozzles 81. In the present embodiment, the etching solution supply nozzles 81 extend in the Y-direction. The plurality of ejection holes in each of the etching solution supply nozzles 81 are formed at equal intervals in the Y-direction.

An end of the circulation pipe 82 is connected to the outer tank 32, and allows the etching solution E to flow in from the outer tank 32. The circulation pipe 82 allows the etching solution E to flow through to the etching solution supply nozzles 81.

The circulation pump 83 is intervened in the circulation pipe 82. The circulation pump 83 drives the etching solution E to flow through the circulation pipe 82 by the pressure of the fluid. As a result, the etching solution E flows from the outer tank 32 to the inner tank 31 via the circulation pipe 82. Specifically, the etching solution E flows through the circulation pipe 82 to be ejected in the inner tank 31 from the ejecting holes in each of the etching solution supply nozzles 8. That is, the etching solution E is supplied from the etching solution supply nozzles 81 in the inner tank 31. The etching solution E is also ejected from the etching solution supply nozzles 81 in the inner tank 31, whereby the etching solution E flows from the inner tank 31 toward the outer tank 32 through the upper end faces of the side walls of the inner tank 31.

The circulation heater 84 and the circulation filter 85 are intervened in the circulation pump 82. The circulation heater 84 heats the etching solution E flowing through the circulation pipe 82. Specifically, the circulation heater 84 heats the etching solution E at a temperature of 120° C. or higher and 160° C. or lower. The circulation filter 85 removes foreign bodies from the etching solution E flowing through the circulation pipe 82.

Figure 3:
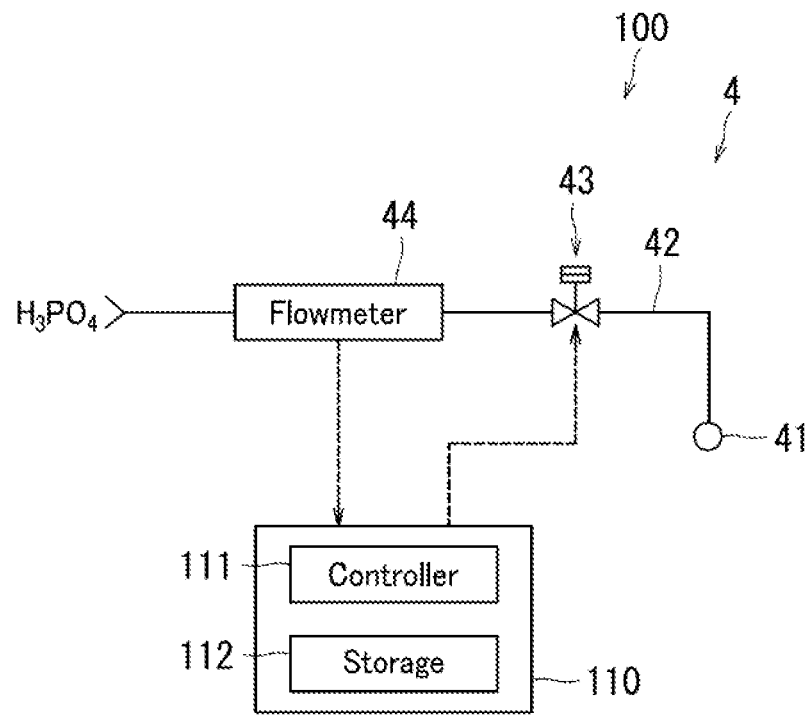
FIG. 3 is a diagram illustrating a phosphoric acid replenishment mechanism included in the substrate processing apparatus according to the first embodiment.

The configuration of the phosphoric acid replenishment mechanism 4 will be then described with reference to FIG. 3. FIG. 3 is a diagram illustrating the phosphoric acid replenishment mechanism 4 included in the substrate processing apparatus 100 according to the present embodiment. As illustrated in FIG. 3, the phosphoric acid replenishment mechanism 4 further includes an on-off valve 43. The on-off valve 43 is intervened in the phosphoric acid supply pipe 42.

The on-off valve 43 is, for example a solenoid valve. The on-off valve 43 opens and closes the flow path of the phosphoric acid supply pipe 42 to control the flow of phosphoric acid flowing through the phosphoric acid supply pipe 42. Specifically, when the on-off valve 43 is opened, phosphoric acid flows to the phosphoric acid supply nozzle 41 via the phosphoric acid supply pipe 42. The phosphoric acid is consequently ejected from the phosphoric acid supply nozzle 41. On the other hand, when the on-off valve 43 is closed, the flow of phosphoric acid is cut off, and the phosphoric acid supply nozzle 41 stops ejecting the phosphoric acid.

The on-off valve 43 is controlled by the control device 110 (controller 111). The controller 111 opens and closes the on-off valve 43 during the etching process on the substrates W to cause the silicon concentration C in the etching solution E to vary. Specifically, the controller 111 opens and closes the on-off valve 43 during the etching process on the substrates W to control a phosphoric acid replenishment flow rate F that is the flow rate of phosphoric acid that the etching solution E is replenished with. As a result, the silicon concentration C in the etching solution E is varied.

Specifically, the phosphoric acid replenishment mechanism 4 further includes a flowmeter 44. The flowmeter 44 is intervened in the phosphoric acid supply pipe 42. The flowmeter 44 measures the flow rate of phosphoric acid flowing through the phosphoric acid supply pipe 42. The flowmeter 44 outputs a signal representing the measurement result to the controller 111. The flowmeter 44 may be, for example an integrated flow meter.

The storage 112 stores a set value for the phosphoric acid replenishment flow rate F. The controller 111 controls the opening and closing of the on-off valve 43 based on the phosphoric acid flow rate measured through the flowmeter 44 and the set value for the phosphoric acid replenishment flow rate F. Thus, the flow rate of phosphoric acid (phosphoric acid replenishment flow rate F) which the etching solution E is to be replenished with is controlled based on the flow rate of phosphoric acid measured through the flowmeter 44 and the set value for the phosphoric acid replenishment flow rate F.

Figure 4:
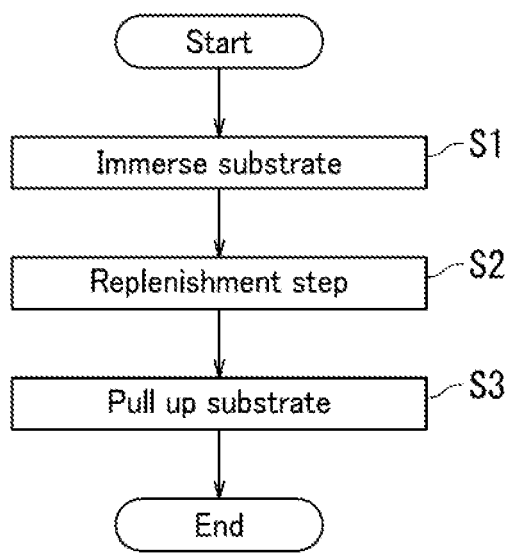
FIG. 4 is a flow chart illustrating a substrate processing method according to the first embodiment.

The substrate processing method according to the present embodiment will be then described with reference to FIG. 4. FIG. 4 is a flow chart illustrating the substrate processing method according to the present embodiment. The substrate processing method according to the present embodiment may be carried out by the substrate processing apparatus 100 described with reference to FIGS. 1A to 3. The following describes the substrate processing method carried out by the substrate processing apparatus 100 described with reference to FIGS. 1A to 3. As illustrated in FIG. 4, the substrate processing method according to the present embodiment includes Steps S1 to S3.

First, at the start of an etching process on a plurality of substrates W, the substrates W are immersed in the etching solution E (Step S1). Specifically, the substrate holding section 130 moves to the processing position. The plurality of substrates W held by the substrate holding section 130 are consequently placed in the inner tank 31 to be immersed in the etching solution E in the inner tank 31. At this time, the silicon concentration C in the etching solution E stored in the processing tank 3 is the first silicon concentration C1.

When the plurality of substrates W are immersed in the etching solution E, the etching process is performed on each substrate W with the etching solution E. The controller 111 causes the silicon concentration C in the etching solution E to vary during the etching process on the substrates W. Specifically, the controller 111 controls the on-off valve 43 of the phosphoric acid replenishment mechanism 4 to replenish the etching solution E in the processing tank 3 with phosphoric acid, thereby causing the silicon concentration C in the etching solution E to vary (Step S2). More specifically, the controller 111 causes the silicon concentration C in the etching solution E to vary from the first silicon concentration C1 to the second silicon concentration C2 by replenishing with phosphoric acid.

When a predetermined time elapses after the plurality of substrates W are immersed in the etching solution E, the plurality of substrates W are pulled up from the etching solution E (Step S3), and the etching process in FIG. 4 is completed. Specifically, the substrate holding section 130 moves from the processing position to the retracted position. As a result, the plurality of substrates W held by the substrate holding section 130 are pulled up from the etching solution E in the inner tank 31.

Figure 5:
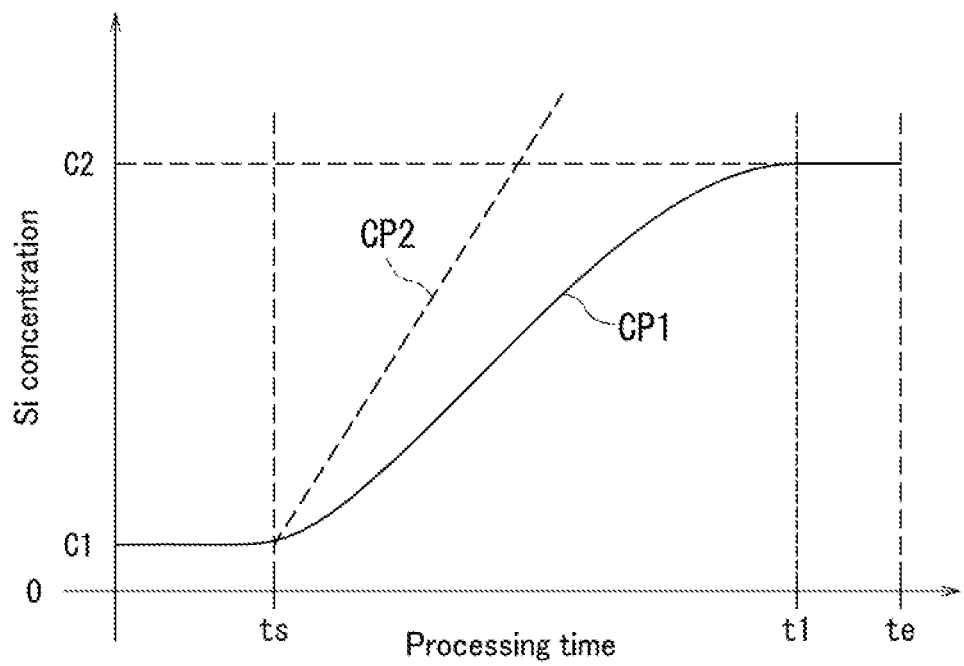
FIG. 5 is a diagram illustrating a varying example of a silicon concentration during an etching process by the substrate process apparatus according to the first embodiment.
Figure 6:
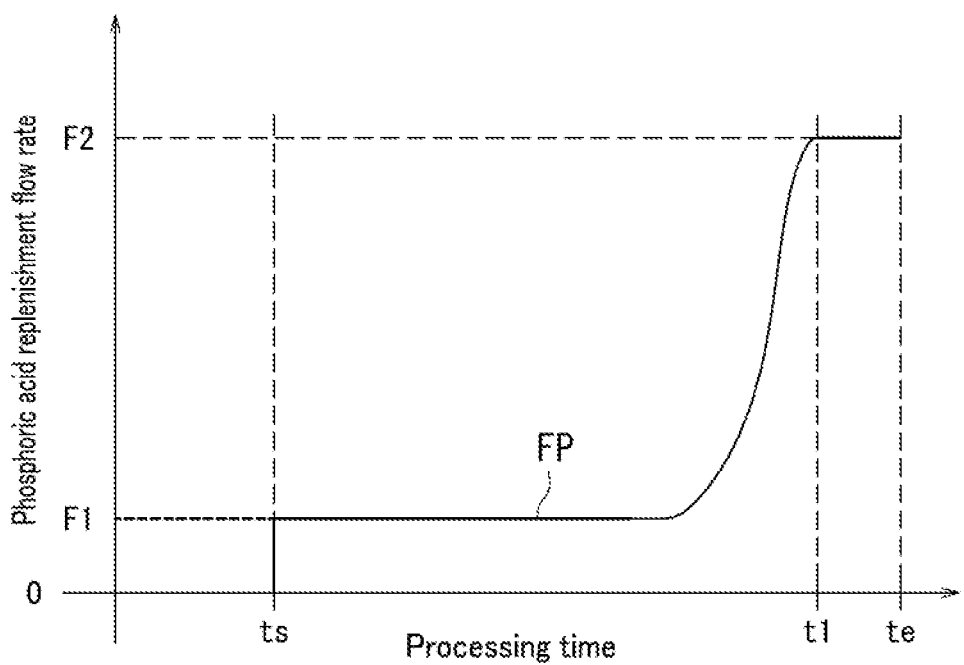
FIG. 6 is a diagram illustrating a transitional example of a phosphoric acid replenishment flow rate during the etching process through the substrate processing apparatus according to the first embodiment.

Varying examples of the silicon concentration C will be then described with reference to FIGS. 1A to 6. FIG. 5 is a diagram illustrating a varying example of the silicon concentration C during an etching process by the substrate processing apparatus 100 according to the present embodiment. FIG. 6 is a diagram illustrating an example of a transition of the phosphoric acid replenishment flow rate F during the etching process by the substrate processing apparatus 100 according to the present embodiment.

In FIG. 5, the vertical axis indicates the silicon concentration C. The horizontal axis indicates the processing time t. Further, Graph CP1 (solid line) illustrates a varying example of the silicon concentration C when the phosphoric acid replenishment mechanism 4 replenishes the etching solution E with phosphoric acid. Graph CP2 (broken line) illustrates a varying example of the silicon concentration C when the etching solution E is replenished with no phosphoric acid. In FIG. 6, the vertical axis indicates the phosphoric acid replenishment flow rate F. The horizontal axis indicates the processing time t. Further, Graph FP illustrates an example of a transition of the flow rate of phosphoric acid, (phosphoric acid replenishment flow rate F), with which the phosphoric acid replenishment mechanism 4 replenishes the etching solution E.

As illustrated in FIG. 5, the silicon concentration C at the etching start time ts is the first silicon concentration C1, and the silicon concentration C at the etching end time te is the second silicon concentration C2. In the example illustrated in FIG. 5, the first silicon concentration C1 is a low concentration and the second silicon concentration C2 is a high concentration. For example, the low concentration is 40 ppm or more and 50 ppm or less when the temperature of the etching solution E is 160° C. The high concentration is 60 ppm when the etching solution E is 160° C.

After the etching process is started and the plurality of substrates W are immersed in the etching solution E, the silicon concentration C increases. As illustrated in Graph CP2, when the etching solution E is replenished with no phosphoric acid during the etching process on the substrates W, the silicon concentration C in the etching solution E increases sharply. On the other hand, in the present embodiment, the phosphoric acid replenishment mechanism 4 replenishes the etching solution E with phosphoric acid during the etching process on the substrates W to dilute the silicon concentration C with the new phosphoric acid. As a result, the silicon concentration C gradually increases as illustrated in Graph CP1.

For example, as illustrated in Graph FP in FIG. 6, the controller 111 starts an etching process to drive the on-off valve of the phosphoric acid replenishment mechanism 4 so that the phosphoric acid replenishment flow rate F maintains the first replenishment flow rate F1 (constant value). As a result, the silicon concentration C gradually increases as illustrated in FIG. 5. Note that the first replenishment flow rate F1 indicates the phosphoric acid replenishment flow rate F at the start of the etching process on the substrates W. In the example in FIG. 6, the first replenishment flow rate F1 is set to a flow rate that gradually increases the silicon concentration C from a low concentration to a high concentration.

As illustrated in FIG. 5, when the silicon concentration C increases to just before the second silicon concentration C2, the controller 111 drives the on-off valve 43 of the phosphoric acid replenishment mechanism 4 so that the phosphoric acid replenishment flow rate F increases as illustrated in FIG. 6. As a result, the silicon concentration C increases more gradually before the second silicon concentration C2, as illustrated in FIG. 5.

As illustrated in FIG. 5, when the processing time t reaches the time t1 before the etching end time te, the silicon concentration C reaches the second silicon concentration C2. At this time, the phosphoric acid replenishment flow rate F has increased to the second replenishment flow rate F2 as illustrated in FIG. 6. After the phosphoric acid replenishment flow rate F reaches the second replenishment flow rate F2, the controller 111 drives the on-off valve 43 of the phosphoric acid replenishment mechanism 4 so that the phosphoric acid replenishment flow rate F maintains the second replenishment flow rate F2. The silicon concentration C consequently maintains the second silicon concentration C2 as illustrated in FIG. 5. The second replenishment flow rate F2 is a flow rate that causes the silicon concentration C to maintain a constant value.

Figure 7:
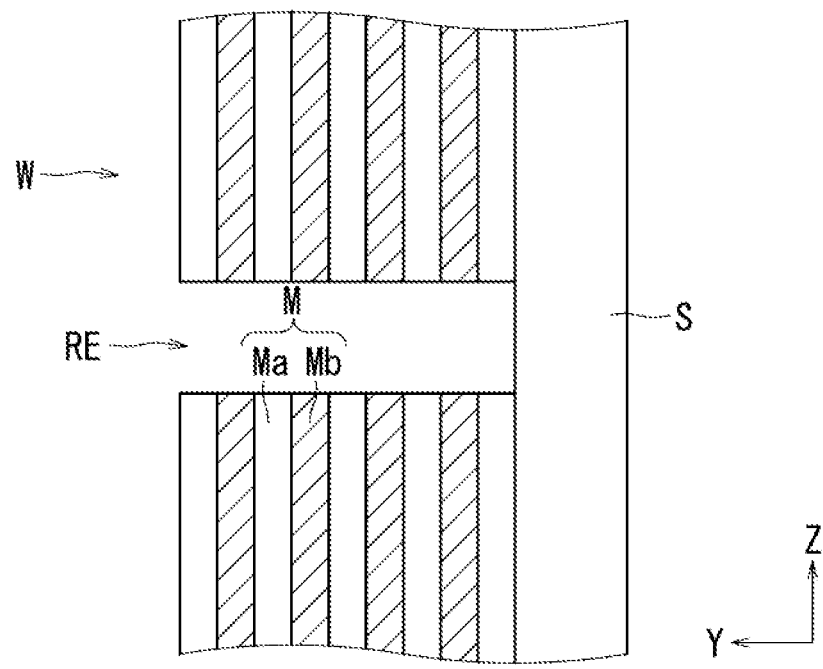
FIG. 7 is a diagram illustrating a substrate before undergoing an etching process through the substrate processing apparatus according to the first embodiment.

The substrates W that undergoes an etching process through the substrate processing apparatus 100 according to the present embodiment will be then described with reference to FIG. 7. FIG. 7 is a diagram illustrating a substrate W before undergoing the etching process through the substrate processing apparatus 100 according to the present embodiment. Substrates W that undergo the etching process through the substrate processing apparatus 100 according to the present embodiment are used for three-dimensional flash memory (e.g., three-dimensional NAND flash memory), for example.

In FIG. 7, the substrate W includes a base material S and a multilayer structure M. The base material S is in the shape of a thin film spreading in the XZ plane. The base material S is made of, for example silicon. The multilayer structure M is formed on the upper surface of the base material S. The multilayer structure M is formed so as to extend in the Y-direction from the upper surface of the base material S. The multilayer structure M includes silicon oxide films Ma and silicon nitride films Mb alternately stacked in the Y-direction. Each of the silicon oxide films Ma spreads parallel to the upper surface of the base material S. Each of the silicon nitride films Mb spreads parallel to the upper surface of the base material S.

Figure 8:
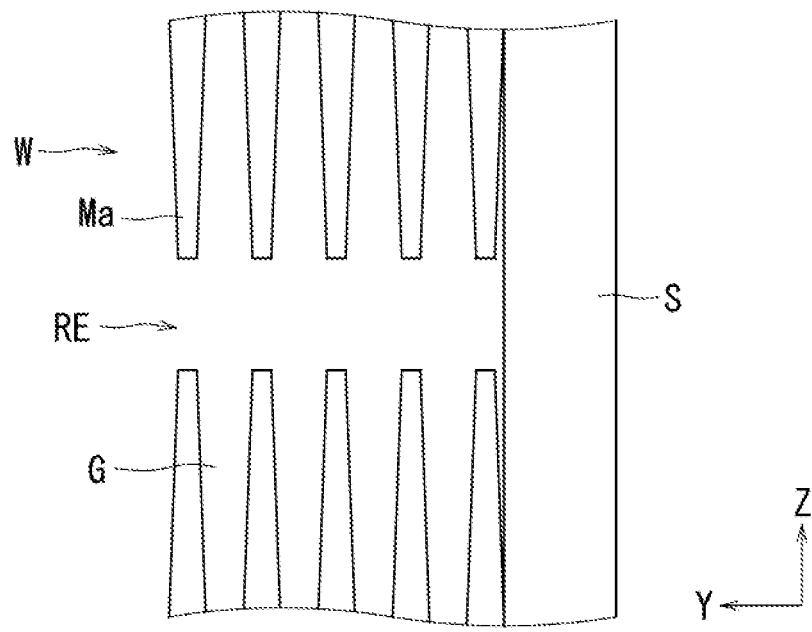
FIG. 8 is a diagram illustrating an example of the substrate after undergoing an etching process through the substrate processing apparatus according to the first embodiment.

The multilayer structure M includes one cavity RE or more. The cavity RE reaches the base material S from the upper surface of the multilayer structure M, and part of the upper surface of the base material S is exposed through the cavity RE. Further, the side walls of the silicon oxide films Ma and the silicon nitride films Mb are exposed from the inner surface of the cavity RE. The cavity RE functions as a trench or a hole when the substrates W are used for semiconductor products, for example An etching process through the substrate processing apparatus 100 according to the present embodiment will be then described with reference to FIGS. 7 and 8. FIG. 8 is a diagram illustrating an example of a substrate W after undergoing an etching process through the substrate processing apparatus 100 according to the present embodiment.

When the substrate W is immersed in the etching solution E, the etching solution E enters the cavity RE. The etching solution E consequently comes into contact with the silicon oxide films Ma and the silicon nitride films Mb at the interface of the cavity RE.

Etch rates (selectivity) of the silicon oxide films Ma and the silicon nitride films Mb by the etching solution E can be controlled by the silicon concentration C in the etching solution E under the condition that the temperature of the etching solution E and the specific gravity value (concentration) of the phosphoric acid are constant. Specifically, when the silicon concentration C in the etching solution E is a high concentration, an etch amount of the silicon oxide films Ma is sufficiently small, and substantially only the silicon nitride films Mb are etched in the multilayer structure M. On the other hand, when the silicon concentration C in the etching solution E is lower than the high concentration, the silicon oxide films Ma are etched together with the silicon nitride films Mb. The etch amount of the silicon oxide films Ma decreases as the silicon concentration C increases. Note that an etch amount of the silicon nitride films Mb is substantially constant and not affected by the silicon concentration C.

In the example described with reference to FIGS. 5 and 6, when the silicon concentration C is varied to the low concentration or the high concentration, the silicon concentration C is the low concentration in the initial stage of the etching process. The silicon oxide films Ma are therefore etched together with silicon nitride films Mb. Specifically, the silicon oxide films Ma and the silicon nitride films Mb are sequentially etched from their respective parts that are on the cavity RE side and in contact with the etching solution E. However, since the etch rate on the silicon nitride films Mb is higher than that on the silicon oxide films Ma, the etch amount of the silicon oxide films Ma is smaller than the etch amount of the silicon nitride films Mb.

Then, the silicon concentration C gradually increases, whereby of the silicon oxide films Ma, their respective parts farther from the cavity RE come into contact with the etching solution E having a higher silicon concentration C. As a result, the silicon oxide films Ma have a smaller width in the Y-direction on the cavity RE side and a larger width in the Y-direction on the farther side from the cavity RE, as illustrated in FIG. 8. Therefore, in the substrates W after the etching process, the gap G between the silicon oxide films Ma adjacent to each other in the stacked direction becomes wider as it is closer to the cavity RE and narrower as it is farther from the cavity RE.

Figure 9:
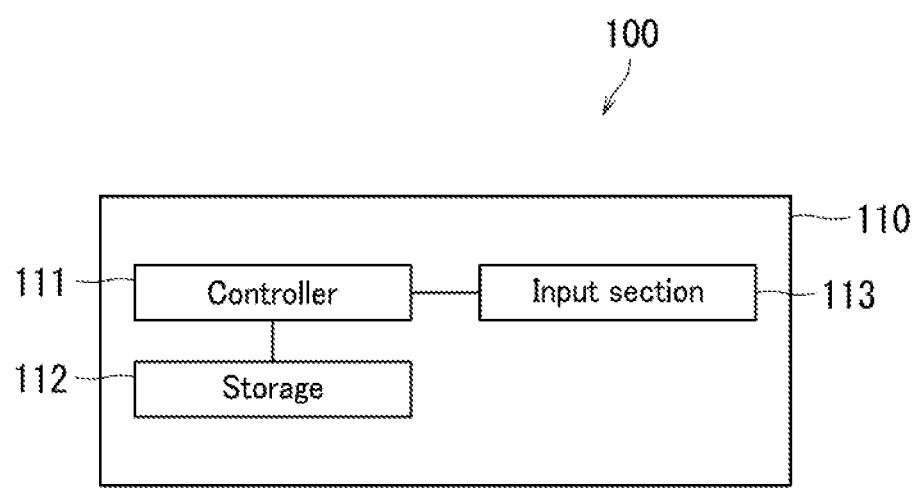
FIG. 9 is a block diagram illustrating the configuration of a control device included in the substrate processing apparatus according to the first embodiment.

The configuration of the control device 110 will be then described with reference to FIG. 9. FIG. 9 is a block diagram illustrating the configuration of the control device 110 included in the substrate processing apparatus 100 according to the present embodiment. As illustrated in FIG. 9, the control device 110 further includes an input section 113.

The input section 113 allows an operator to enter data through. The input section 113 is a user interface device for an operation by the operator. The input section 113 enters data into the controller 111 according to the operation by the operator. The controller 111 stores the data entered through the input section 113 in the storage 112. The input section 113 includes, for example, a keyboard and a mouse. The input section 113 may include a touch sensor.

A set value for the phosphoric acid replenishment flow rate F is entered through the input unit 113. Specifically, the operator operates the input section 113 to enter a set value according to the structure of the semiconductor device to be manufactured by using substrates W after being processed through the substrate processing apparatus 100. For example, the operator enters a set value for the phosphoric acid replenishment flow rate F according to the size of the gap G described with reference to FIG. 8.

More specifically, the operator enters, as the set value for the phosphoric acid replenishment flow rate F, data indicating the relationship between the processing time t of the etching process and the phosphoric acid replenishment flow rate F. For example, the operator may enter data corresponding to Graph FP described with reference to FIG. 6 as the set value for the phosphoric acid replenishment flow rate F. Specifically, the operator enters, as the set value for the phosphoric acid replenishment flow rate F, data indicating the first replenishment flow rate F1, data indicating the second replenishment flow rate F2, and data indicating varying timing from the first replenishment flow rate F1 to the second replenishment flow rate F2. The controller 111 controls the on-off valve 43 of the phosphoric acid replenishment mechanism 4 based on a phosphoric acid flow rate measured through the flowmeter 44 and the set value for the phosphoric acid replenishment flow rate F. The phosphoric acid replenishment flow rate F consequently transitions as illustrated in Graph FP in FIG. 6. The silicon concentration C in the etching solution E therefore varies as illustrated in Graph CP1 in FIG. 5, and the shape of each substrate W becomes the shape as illustrated in FIG. 8.

Figure 10:
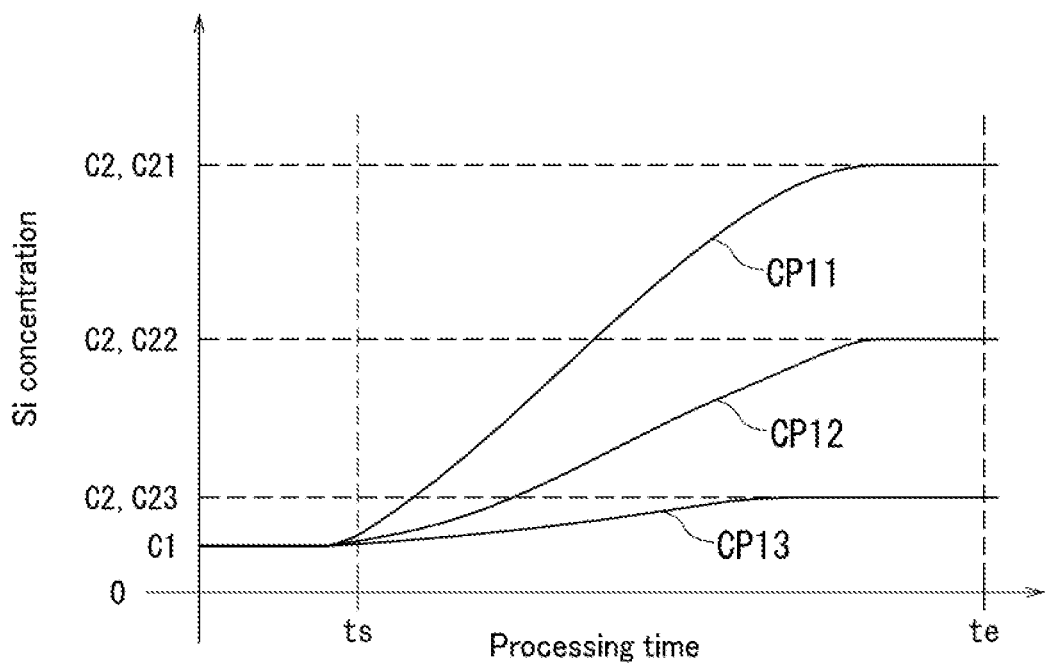
FIG. 10 is a diagram illustrating first to third varying examples of corresponding silicon concentrations during their respective etching processes through the substrate processing apparatus according to the first embodiment.
Figure 11:
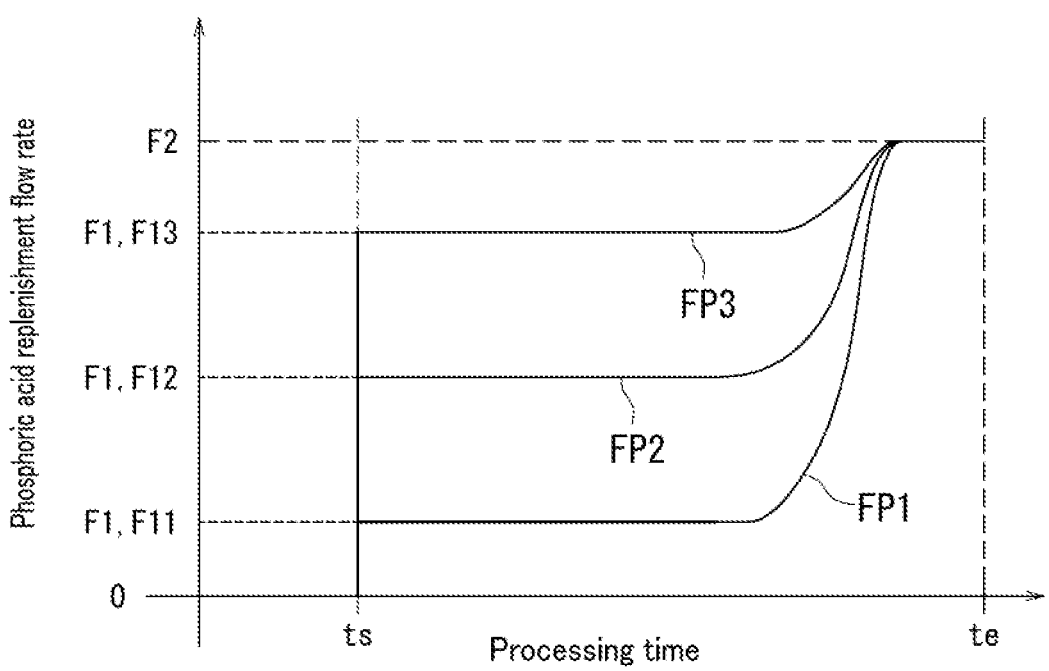
FIG. 11 is a diagram illustrating first to third transitional examples of corresponding phosphoric acid replenishment flow rates during the respective etching processes through the substrate processing apparatus according to the first embodiment.
Figure 12:
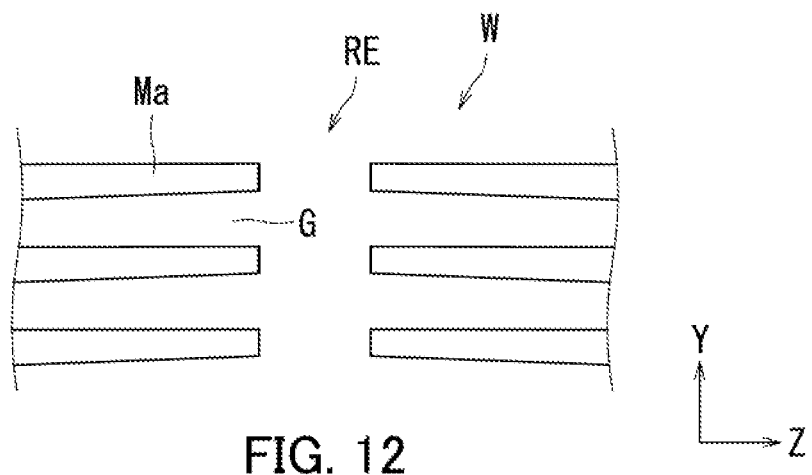
FIG. 12 is a diagram illustrating a first example of a substrate after undergoing an etching process through the substrate processing apparatus according to the first embodiment.
Figure 13:
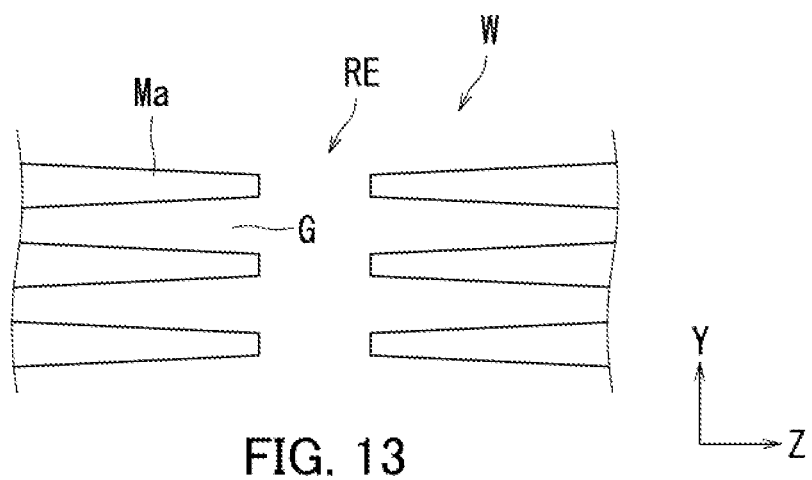
FIG. 13 is a diagram illustrating a second example of a substrate after undergoing an etching process through the substrate processing apparatus according to the first embodiment.
Figure 14:
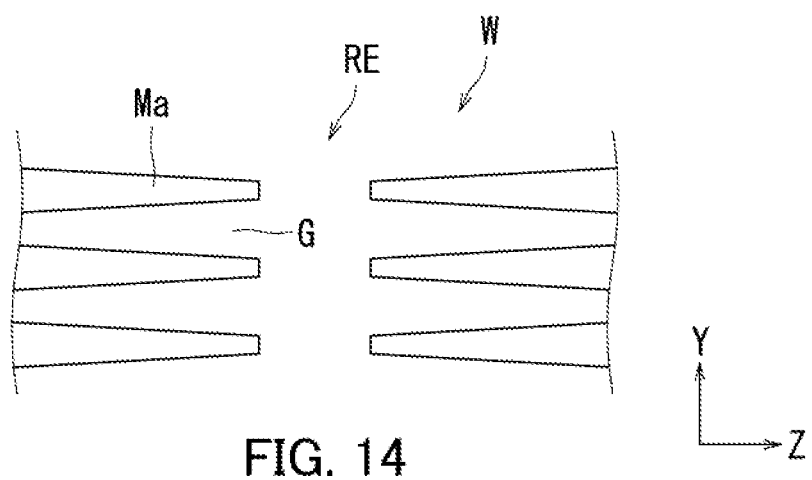
FIG. 14 is a diagram illustrating a third example of a substrate after undergoing an etching process through the substrate processing apparatus according to the first embodiment.

First to third varying examples of corresponding silicon concentrations C will be then described with reference to FIGS. 1A to 14. FIG. 10 is a diagram illustrating the first to third varying examples of the corresponding silicon concentrations C during their respective etching processes through the substrate processing apparatus 100 according to the present embodiment. FIG. 11 is a diagram illustrating first to third transitional examples of corresponding phosphoric acid replenishment flow rates F during the respective etching processes through the substrate processing apparatus 100 according to the present embodiment. FIGS. 12 to 14 illustrate first to third examples of corresponding substrates W after undergoing their respective etching processes through the substrate processing apparatus 100 according to the present embodiment.

In FIG. 10, the vertical axis indicates the silicon concentration C. The horizontal axis indicates the processing time t. Further, Graphs CP11 to CP13 illustrate first to third varying examples of corresponding silicon concentrations C. In FIG. 11, the vertical axis indicates the phosphoric acid replenishment flow rate F. The horizontal axis indicates the processing time t. Further, Graphs FP1 to FP3 illustrate first to third transitional examples of corresponding flow rates of phosphoric acid, (phosphoric acid replenishment flow rate F), with which the phosphoric acid replenishment mechanism 4 replenishes the etching solution E.

As illustrated in FIG. 10, the first to third examples (Graphs CP11 to CP13) differ from each other in the second silicon concentrations C2 (C21 to C23). Specifically, the second silicon concentration C21 in the first example (Graph CP11) is higher than the second silicon concentration C22 in the second example (Graph CP12). The second silicon concentration C22 in the second example (Graph CP12) is higher than the second silicon concentration C23 in the third example (Graph CP13). As illustrated in FIG. 11, the first to third examples (Graphs FP1 to FP3) differ from each other in the first replenishment flow rates F1 (F11 to F13). Specifically, the first replenishment flow rate F11 in the first example (Graph FP1) is smaller than the first replenishment flow rate F12 in the second example (Graph FP2). The first replenishment flow rate F12 in the second example (Graph FP2) is smaller than the first replenishment flow rate F13 in the third example (Graph FP3).

As illustrated in FIGS. 10 and 11, the larger the first replenishment flow rate F1 becomes, the smaller the second silicon concentration C2 becomes. Further, as illustrated in FIGS. 12 to 14, the smaller the second silicon concentration C2 becomes, the wider the gap G becomes. Specifically, the smaller the second silicon concentration C2 becomes, the larger the etching amount of the silicon oxide films Ma becomes. Therefore, the etching amount of the silicon oxide films Ma increases toward the cavity RE side where the contact time with the etching solution E becomes longer. The gap G becomes wider toward the cavity RE side. For example, the gap G of the substrate W in the first example of FIG. 12 is narrower on the cavity RE side than that of the substrate W in the second example of FIG. 13. The gap G of the substrate W in the second example of FIG. 13 is narrower on the cavity RE side than that of the substrate W in the third example of FIG. 14.

Figure 15:
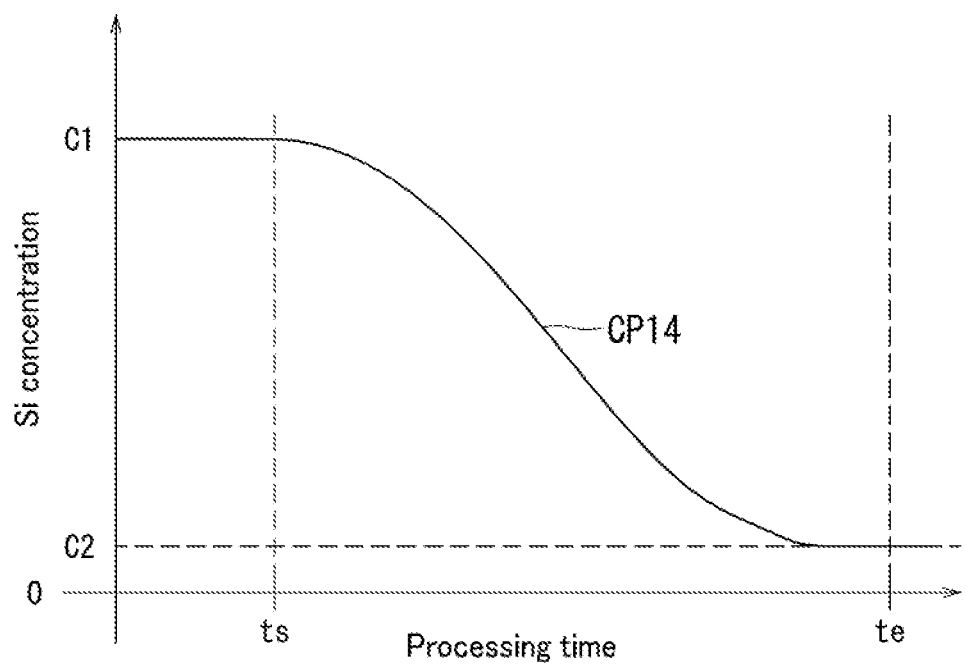
FIG. 15 is a diagram illustrating a fourth varying example of the silicon concentration during an etching process by the substrate processing apparatus according to the first embodiment.
Figure 16:
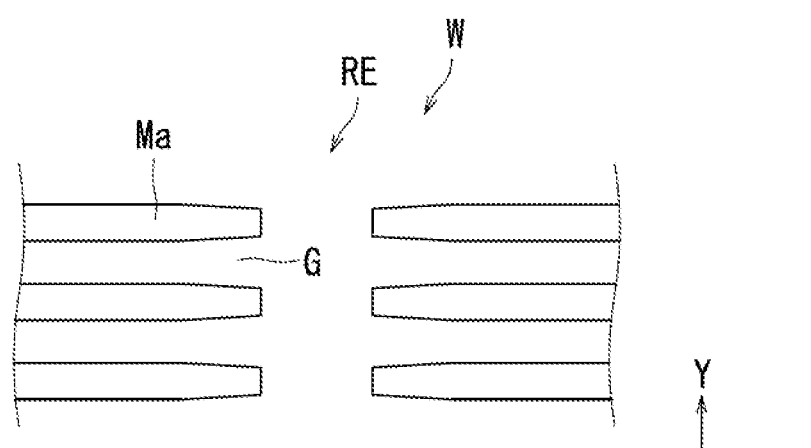
FIG. 16 is a diagram illustrating a fourth example of the substrate after undergoing an etching process through the substrate processing apparatus according to the first embodiment.

A fourth varying example of the silicon concentration C will be then described with reference to FIGS. 15 and 16. FIG. 15 is a diagram illustrating a fourth varying example of the silicon concentration C during an etching process through the substrate processing apparatus 100 according to the present embodiment. FIG. 16 is a diagram illustrating a fourth example of a substrate W after undergoing the etching process through the substrate processing apparatus 100 according to the present embodiment.

In FIG. 15, the vertical axis indicates the silicon concentration C. The horizontal axis indicates the processing time t. Further, Graph CP14 illustrates a fourth varying example of the silicon concentration C. As illustrated in FIG. 15, in the fourth example, the first silicon concentration C1 is higher than the second silicon concentration C2. Specifically, the first silicon concentration C1 is a high concentration, and the second silicon concentration C2 is a low concentration. In this case, since the silicon concentration C is the high concentration in the initial stage of the etching process, almost only the silicon nitride films Mb are etched in the multilayer structures M. Then, the silicon concentration C gradually decreases. The etching amount of the silicon oxide films Ma then becomes larger toward the cavity RE side where the contact time with the etching solution E becomes longer as illustrated in FIG. 16. As a result, the width of each silicon oxide film Ma in the Y-direction becomes small on the cavity RE side, and increases as the distance from the cavity RE increases.

The first embodiment has been described above with reference to FIGS. 1A to 16. The present embodiment enables the silicon concentration C in the etching solution E to vary during the etching process on the substrates W. The present embodiment therefore makes it possible to control the shape of the silicon oxide films Ma to form the substrates W into a special shape.

Second Embodiment

The second embodiment will be then described with reference to FIG. 17. However, matters different from those of the first embodiment will be described, and description of the same matters as those of the first embodiment will be omitted. The second embodiment is different from the first embodiment in that a substrate processing apparatus 100 includes a silicon concentration measuring device 86.

Figure 17:
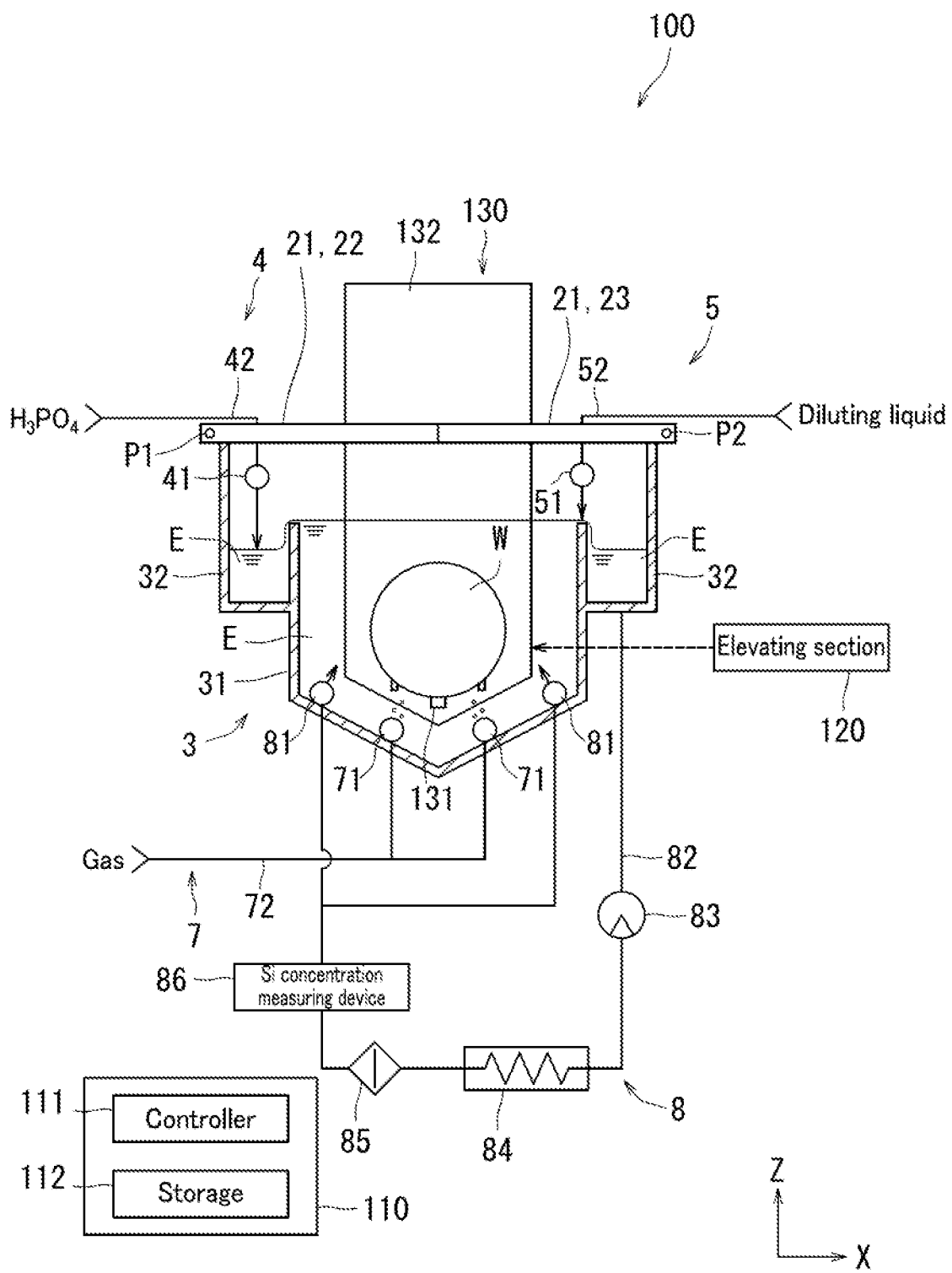
FIG. 17 is a cross-sectional view illustrating the configuration of a substrate processing apparatus according to a second embodiment.

FIG. 17 is a cross-sectional view illustrating the configuration of the substrate processing apparatus 100 according to the present embodiment. As illustrated in FIG. 17, the substrate processing apparatus 100 according to the present embodiment further includes the silicon concentration measuring device 86. The silicon concentration measuring device 86 measures the silicon concentration C in the etching solution E. The silicon concentration measuring device 86 outputs a signal representing the measurement result to a controller 111.

In the present embodiment, the silicon concentration measuring device 86 is intervened in a circulation pipe 82. The silicon concentration measuring device 86 therefore measures the silicon concentration C in the etching solution E flowing through the circulation pipe 82. Specifically, the silicon concentration measuring device 86 is placed on the downstream side (inner tank 31 side) of a circulation filter 85. The silicon concentration measuring device 86 therefore measures the silicon concentration C in the etching solution E after foreign bodies are removed. This makes it possible to enhance the precision of the measurement result of the silicon concentration C in the etching solution E through the silicon concentration measuring device 86.

In the present embodiment, the controller 111 controls the opening and closing of an on-off valve 43 (see FIG. 3) of a phosphoric acid replenishment mechanism 4 based on the silicon concentration C measured through the silicon concentration measuring device 86. In other words, the controller 111 controls the flow rate of phosphoric acid, (phosphoric acid replenishment flow rate F), with which the phosphoric acid replenishment mechanism 4 replenishes the etching solution E based on the silicon concentration C measured through the silicon concentration measuring device 86.

More specifically, the controller 111 controls the phosphoric acid replenishment flow rate F based on a set value for the silicon concentration C stored in storage 112 and the silicon concentration C measured through the silicon concentration measuring device 86.

Specifically, the storage 112 stores, as a set value for the silicon concentration C, data indicating the relationship between the processing time t of the etching process and the silicon concentration C. Alternatively, the storage 112 stores data indicating the relationship between the processing time t of the etching process and the varying rate of the silicon concentration C. For example, the storage 112 may store the data corresponding to Graph CP1 described with reference to FIG. 5. In this case, the controller 111 controls the on-off valve 43 (see FIG. 3) of the phosphoric acid replenishment mechanism 4 so that the silicon concentration C measured through the silicon concentration measuring device 86 follows the variation of the silicon concentration C as illustrated in Graph CP1 of FIG. 5. Each substrate W is formed into the shape as illustrated in FIG. 8.

The second embodiment has been described above with reference to FIG. 17. The present embodiment enables the silicon concentration C in the etching solution E to vary during the etching process on the substrates W like the first embodiment. The present embodiment makes it possible to control the shape of the silicon oxide films Ma to form the substrates W into a special shape.

Third Embodiment

A third embodiment will be described with reference to FIGS. 18 to 24. However, the matters different from those of the first and second embodiments will be described, and the same matters as those of the first and second embodiments will be omitted. The third embodiment is different from the first and second embodiments in that a substrate processing apparatus 100 includes a silicon supply mechanism 45.

Figure 18:
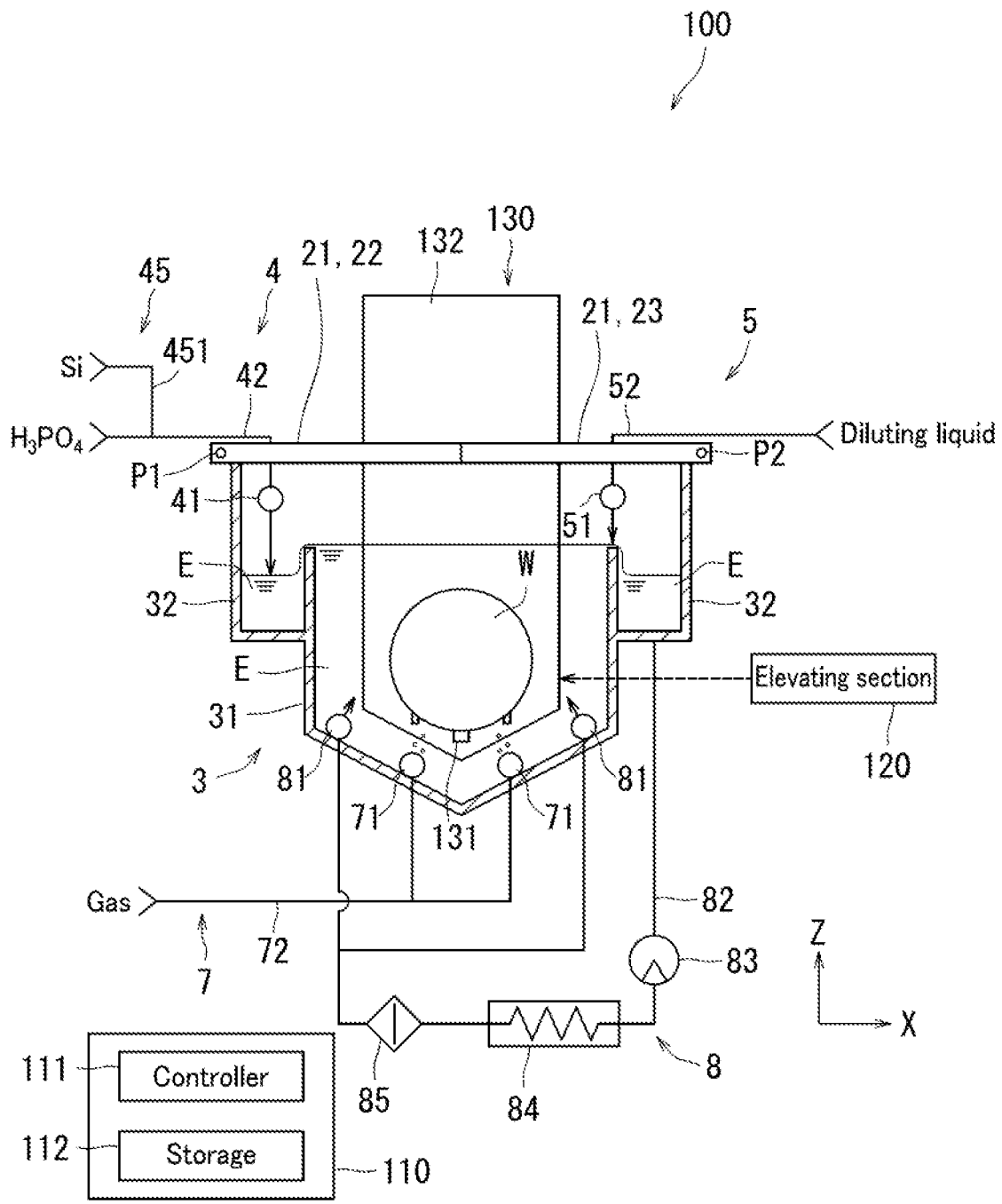
FIG. 18 is a cross-sectional view illustrating the configuration of a substrate processing apparatus according to a third embodiment.

FIG. 18 is a cross-sectional view illustrating the configuration of the substrate processing apparatus 100 according to the present embodiment. As illustrated in FIG. 18, the substrate processing apparatus 100 according to the present embodiment further includes the silicon supply mechanism 45. The silicon supply mechanism 45 supplies a silicon containing liquid to the phosphoric acid that an etching liquid E is replenished with. The silicon containing liquid is a liquid that contains silicon. Note that the silicon containing liquid is, for example a suspension containing silicon. Hereinafter, the phosphoric acid that the etching liquid E is replenished with may be referred to as "supplemental phosphoric acid".

Specifically, the silicon supply mechanism 45 includes a silicon supply pipe 451. An end of the silicon supply pipe 451 is connected to a phosphoric acid supply pipe 42. The silicon supply pipe 451 allows the silicon containing liquid to flow through to the phosphoric acid supply pipe 42. The silicon containing liquid is therefore supplied to the supplemental phosphoric acid flowing through the phosphoric acid supply pipe 42. As a result, the supplemental phosphoric acid containing silicon is ejected from a phosphoric acid supply nozzle 41 toward an outer tank 32. Hereinafter, the supplemental phosphoric acid containing silicon may be referred to as "silicon containing phosphoric acid".

Figure 19:
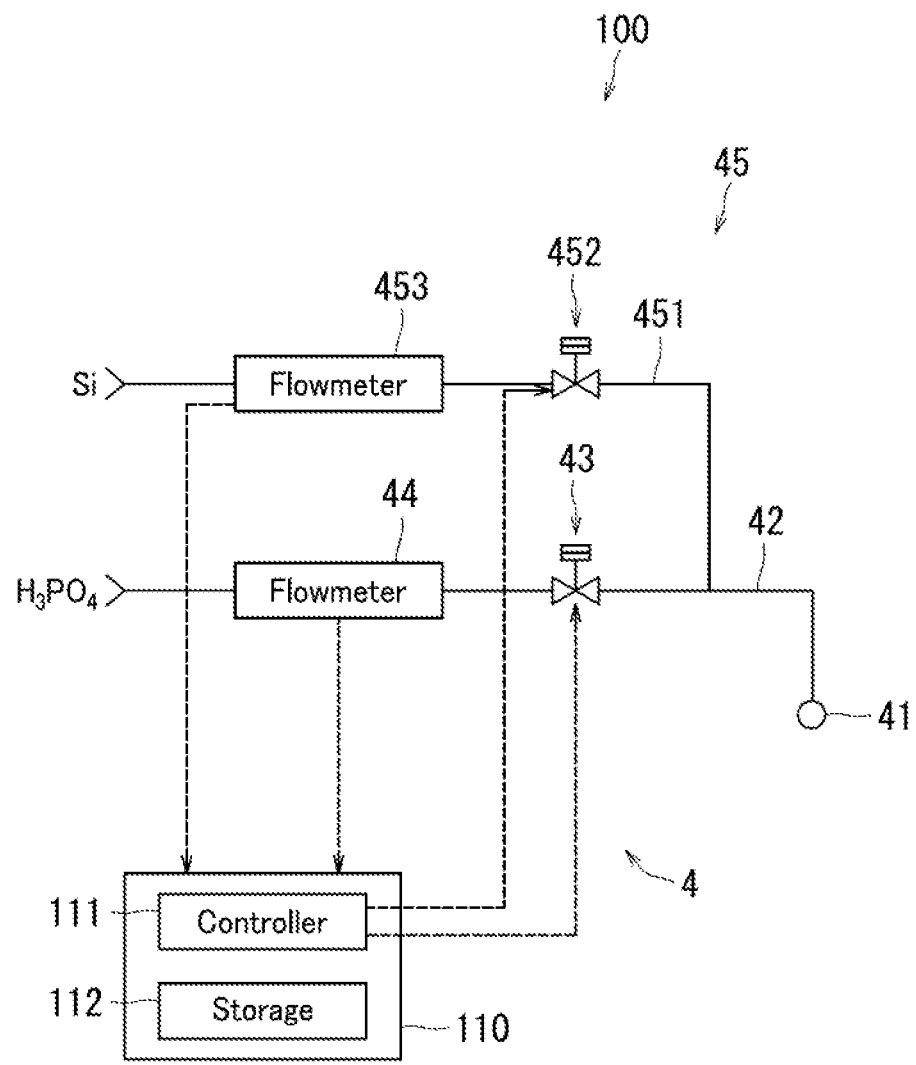
FIG. 19 is a diagram illustrating a phosphoric acid replenishment mechanism and a silicon supply mechanism included in the substrate processing apparatus according to the third embodiment.

The configuration of the silicon supply mechanism 45 will be then described with reference to FIG. 19. FIG. 19 is a diagram illustrating a phosphoric acid replenishment mechanism 4 and the silicon supply mechanism 45 included in the substrate processing apparatus 100 according to the present embodiment. As illustrated in FIG. 19, the silicon supply mechanism 45 further includes an on-off valve 452. The on-off valve 452 is intervened in the silicon supply pipe 451. Note that in the following description, the on-off valve 43 of the phosphoric acid replenishment mechanism 4 may be described as a "first on-off valve 43", and the on-off valve 452 of the silicon supply mechanism 45 may be described as a "second on-off valve 452".

The second on-off valve 452 is, for example a solenoid valve. The second on-off valve 452 opens and closes the flow path of the silicon supply pipe 451 to control the flow of the silicon containing liquid flowing through the silicon supply pipe 451. Specifically, when the second on-off valve 452 is opened, the silicon containing liquid flows to the phosphoric acid supply pipe 42 through the silicon supply pipe 451. The silicon containing phosphoric acid is consequently ejected from the phosphoric acid supply nozzle 41. On the other hand, when the second on off valve 452 is closed, the flow of the silicon containing liquid is cut off, and the supply of silicon (silicon containing liquid) to the phosphoric acid flowing through the phosphoric acid supply pipe 42 is stopped.

The second on-off valve 452 is controlled by a control device 110 (controller 111). The controller 111 opens and closes the first on-off valve 43 and the second on-off valve 452 during an etching process on substrates W to cause the silicon concentration C in an etching solution E to vary. Specifically, the controller 111 opens and closes the second on-off valve 452 during the etching process on the substrates W to control a silicon supply flow rate R that is a flow rate of the silicon containing liquid to be supplied to the supplemental phosphoric acid. The controller 111 also opens and closes the first on-off valve 43 during the etching process on the substrates W to control the flow rate of the silicon containing phosphoric acid and the flow rate of the supplemental phosphoric acid (new liquid).

Specifically, the silicon supply mechanism 45 further comprises a flowmeter 453. The flowmeter 453 is intervened in the silicon supply pipe 451. The flow meter 453 measures the flow rate of the silicon containing liquid flowing through the silicon supply pipe 451. The flowmeter 453 outputs a signal representing the measurement result to the controller 111. The flowmeter 453 may be, for example an integrated flowmeter.

Storage 112 stores a set value for the silicon supply flow rate R. The controller 111 controls the opening and closing of the second on-off valve 452 based on the flow rate of the silicon containing liquid measured through the flowmeter 453 and the set value for the silicon supply flow rate R. In other words, the controller 111 controls a supply flow rate (silicon supply flow rate R) of the silicon containing liquid to be supplied to the supplemental phosphoric acid based on the flow rate of the silicon containing liquid measured through the flowmeter 453 and the set value for the silicon supply flow rate R.

Figure 20:
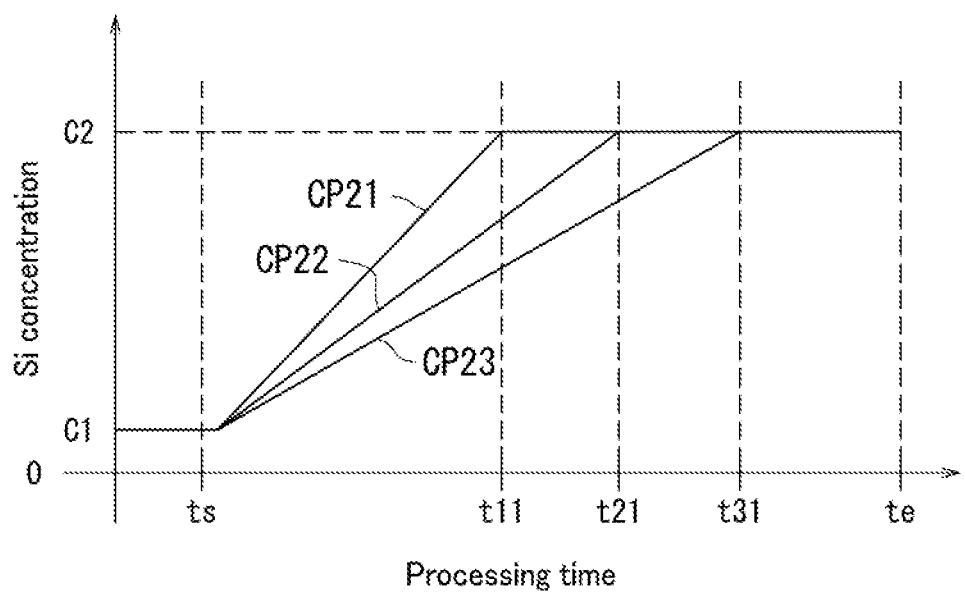
FIG. 20 is a diagram illustrating first to third varying examples of corresponding silicon concentrations during their respective etching processes through the substrate processing apparatus according to the third embodiment.
Figure 21:
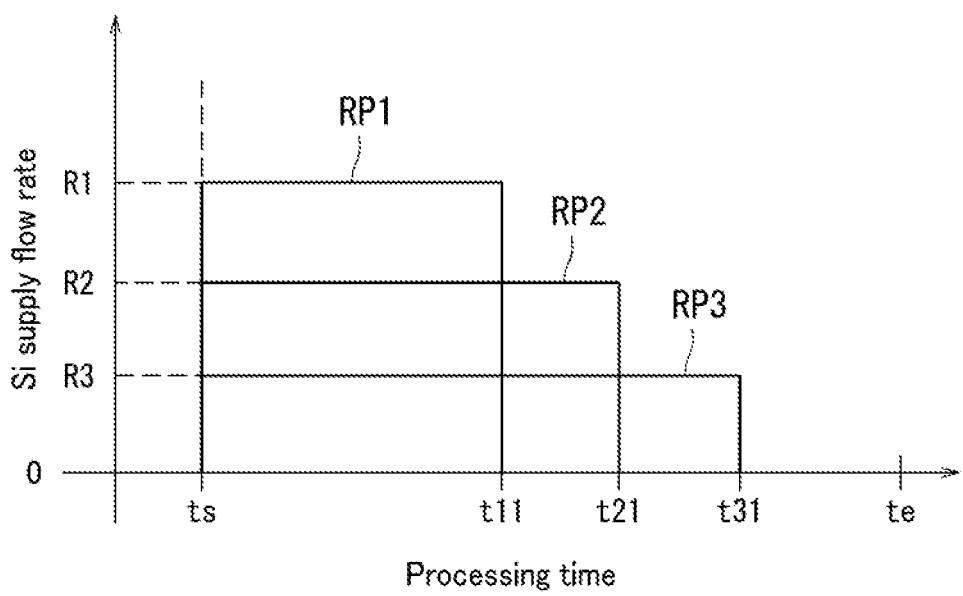
FIG. 21 is a diagram illustrating first to third transitional examples of corresponding silicon supply flow rates during the respective etching processes through the substrate processing apparatus according to the third embodiment.
Figure 22:
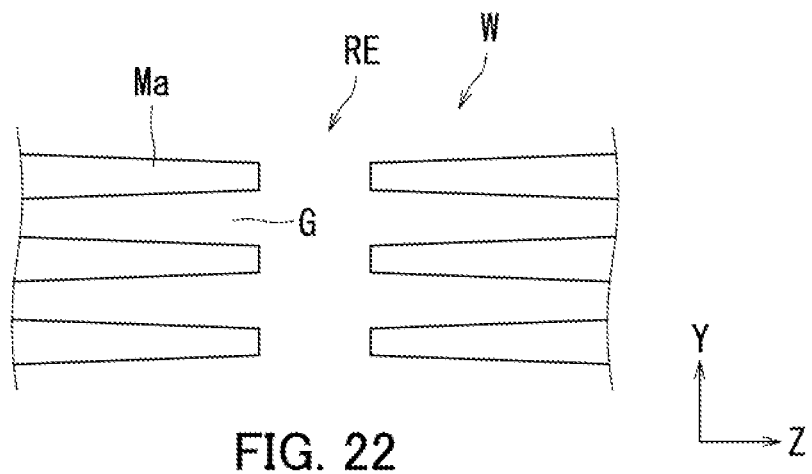
FIG. 22 is a diagram illustrating a first example of a substrate after undergoing an etching process through the substrate processing apparatus according to the third embodiment.
Figure 23:
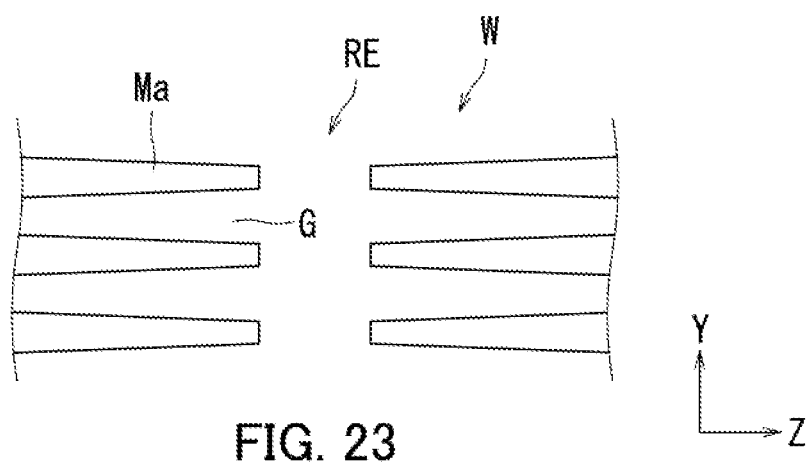
FIG. 23 is a diagram illustrating a second example of a substrate after undergoing an etching process through the substrate processing apparatus according to the third embodiment.
Figure 24:
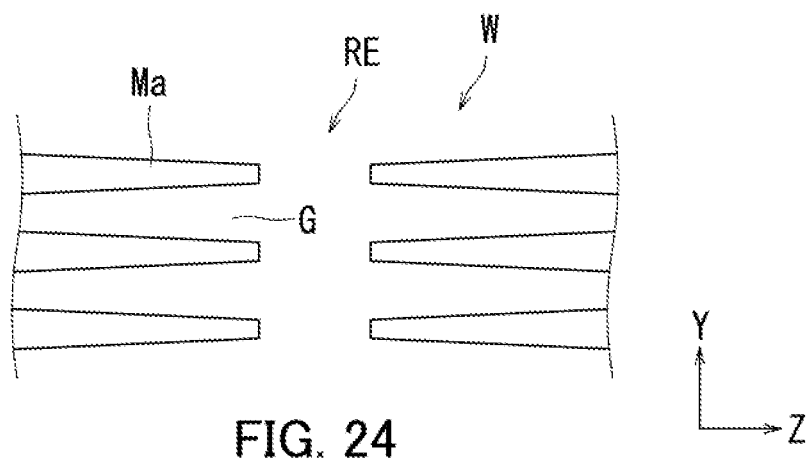
FIG. 24 is a diagram illustrating a third example of a substrate after undergoing an etching process through the substrate processing apparatus according to the third embodiment.

First to third varying examples of corresponding silicon concentrations C will be then described with reference to FIGS. 18 to 24. FIG. 20 is a diagram illustrating the first to third varying examples of the corresponding silicon concentrations C during their respective etching processes through the substrate processing apparatus 100 according to the present embodiment. FIG. 21 is a diagram illustrating first to third transitional examples of corresponding silicon supply flow rates R during the respective etching processes through the substrate processing apparatus 100 according to the present embodiment. FIGS. 22 to 24 illustrate first to third examples of corresponding substrates W after undergoing the respective etching processes through the substrate processing apparatus 100 according to the present embodiment.

In FIG. 20, the vertical axis indicates the silicon concentration C. The horizontal axis indicates the processing time t. Further, Graphs CP21 to CP23 illustrate first to third varying examples of corresponding silicon concentrations C. In FIG. 21, the vertical axis indicates the silicon supply flow rate R. The horizontal axis indicates the processing time t. Further, Graphs RP1 to RP3 illustrate first to third varying examples of corresponding supply flow rates (silicon supply flow rates R) of silicon containing liquids.

As illustrated in FIG. 20, the silicon concentration C varies from a first silicon concentration C1 to a second silicon concentration C2 during the etching process on the substrates W. In the example of FIG. 20, the second silicon concentration C2 has a higher concentration than the first silicon concentration C1.

After the etching process is started and the plurality of substrates W are immersed in the etching solution E, the silicon concentration C increases. In the first to third examples, their respective lengths of time required for the silicon concentration C to vary from the first silicon concentration C1 to the second silicon concentration C2 are different from each other. Hereinafter, the length of time required for the silicon concentration C to vary from the first silicon concentration C1 to the second silicon concentration C2 may be referred to as a "silicon concentration varying period".

Specifically, a silicon concentration varying period (ts to t11) in the first example (Graph CP21) is shorter than a silicon concentration varying period (ts to t21) in the second example (Graph CP22). In other words, the silicon concentration C in the first example reaches the second silicon concentration C2 from the first silicon concentration C1 at a timing earlier than that in the second example. Therefore, a varying rate of the silicon concentration C in the first example is larger than that of the silicon concentration C in the second example.

A silicon concentration varying period (ts to t21) in the second example (Graph CP22) is shorter than a silicon concentration varying period (ts to t31) in the third example (Graph CP23). In other words, the silicon concentration C in the second example reaches the second silicon concentration C2 from the first silicon concentration C1 at a timing earlier than that in the third example. Therefore, a varying rate of the silicon concentration C in the second example is larger than a varying rate of the silicon concentration C in the third example.

As illustrated in FIG. 21, the silicon containing liquid is supplied to the supplemental phosphoric acid at the start of the etching process (etching start time ts). The etching solution E is therefore replenished with the silicon containing phosphoric acid at the start of the etching process (etching start time ts). Specifically, when the etching process is started and the plurality of substrates W are immersed in the etching solution E, the silicon supply mechanism 45 supplies the silicon containing liquid to the supplemental phosphoric acid at a constant supply flow rate, and stops the supply of the silicon containing liquid after a predetermined time elapses.

As illustrated in Graphs RP1 to RP3, in the first to third examples, their respective silicon supply periods and silicon supply flow rates R are different from each other. Herein, each of the silicon supply periods is the length of time for supplying the silicon containing liquid.

Specifically, a silicon supply period (ts to t11) in the first example (Graph RP1) is shorter than a silicon supply period (ts to t21) in the second example (Graph RP2), and the silicon supply flow rate R1 in the first example (graph RP1) is larger than a silicon supply flow rate R2 in the second example (Graph RP2). As a result, as described with reference to FIG. 20, the silicon concentration C in the first example reaches the second silicon concentration C2 from the first silicon concentration C1 at a timing earlier than that in the second example, and a varying rate of the silicon concentration C in the first example is larger than a varying rate of the silicon concentration C in the second example.

The silicon supply period (ts to t21) in the second example (Graph RP2) is shorter than a silicon supply period (ts to t31) in the third example (Graph RP3), and the silicon supply flow rate R2 in the second example (Graph RP2) is larger than a silicon supply flow rate R3 in the third example (Graph RP3). As a result, as described with reference to FIG. 20, the silicon concentration C in the second example reaches the second silicon concentration C2 from the first silicon concentration C1 at a timing earlier than that in the third example, and the varying rate of the silicon concentration C in the second example is larger than a varying rate of the silicon concentration C in the third example.

After the end of the silicon supply period, a new phosphoric acid solution is supplied to the etching solution E from the phosphoric acid replenishment mechanism 4 in order to maintain the silicon concentration C at the second silicon concentration C2.

As described with reference to FIGS. 20 and 21, the silicon concentration C in the first example reaches the second silicon concentration C2 from the first silicon concentration C1 at a timing earlier than that in the second example. As a result, as illustrated in FIGS. 22 and 23, a gap G in each substrate W (FIG. 22) in the first example becomes narrower than a gap G of each substrate W (FIG. 23) in the second example. Further, the silicon concentration C in the second example reaches the second silicon concentration C2 from the first silicon concentration C1 at a timing earlier than that in the third example. As a result, as illustrated in FIGS. 23 and 24, the gap G of each substrate W (FIG. 23) in the second example becomes narrower than a gap G of each substrate W (FIG. 24) in the third example.

Here, data entered in the control device 110 by an operator will be described with reference to FIG. 9. In the present embodiment, the operator enters data indicating the relationship between the processing time t of the etching process and the silicon supply flow rate R as the set value for the silicon supply flow rate R. For example, the operator may enter data corresponding to Graph RP1 described with reference to FIG. 21 as the set value for the silicon supply flow rate R. In this case, the controller 111 controls the silicon supply flow rate R as illustrated in Graph RP1 of FIG. 21 based on the flow rate of the silicon containing liquid measured through the flowmeter 453 of the silicon supply mechanism 45 and the set value for the silicon supply flow rate R. As a result, the silicon concentration C in the etching solution E varies as illustrated in Graph CP21 of FIG. 20, and the shape of each substrate W becomes the shape as illustrated in FIG. 22.

The third embodiment has been described above with reference to FIGS. 18 to 24. The present embodiment enables the silicon concentration C in the etching solution E to vary during the etching process on the substrates W, like the first embodiment. The present embodiment therefore makes it possible to control the shape of the silicon oxide films Ma to form each substrate W into a special shape.

Note that the substrate processing apparatus 100 may include a silicon concentration measuring device 86 like the second embodiment. In this case, the controller 111 controls the opening and closing of the on-off valve 452 of the silicon supply mechanism 45 based on the silicon concentration C measured through the silicon concentration measuring device 86. In other words, the controller 111 controls the flow rate of the silicon containing liquid (silicon supply flow rate R) to be supplied to the supplemental phosphoric acid based on the silicon concentration C measured through the silicon concentration measuring device 86.

More specifically, the controller 111 controls the silicon supply flow rate R based on the set value for the silicon concentration C stored in the storage 112 and the silicon concentration C measured through the silicon concentration measuring device 86.

Specifically, the storage 112 stores data indicating the relationship between the processing time t of the etching process and the silicon concentration C as the set value for the silicon concentration C. Alternatively, the storage 112 stores data indicating the relationship between the processing time t of the etching process and the varying rate of the silicon concentration C. For example, the storage 112 may store data corresponding to Graph CP21 described with reference to FIG. 20. In this case, the controller 111 controls the opening and closing of the on-off valve 452 of the silicon supply mechanism 45 so that the silicon concentration C measured through the silicon concentration measuring device 86 follows the variation of the silicon concentration C as illustrated in Graph CP21 of FIG. 20.

The embodiments of the present disclosure have been described above with reference to the drawings (FIGS. 1A to 24). However, the present disclosure is not limited to the above-described embodiments, and may be implemented in various aspects without departing from the gist thereof. In addition, the plurality of components disclosed in the above embodiments can be appropriately altered. For example, a component of all the components in an embodiment may be added as a component of another embodiment, or some components of all the components in an embodiment may be removed.

The drawings schematically illustrate each component as a main body in order to make it easier to understand. The thickness, length, numbers, intervals and the like of illustrated components may differ from the actual ones for the convenience of the drawing. Further, each component illustrated in the above embodiments is an example and not particularly limited, and various modifications may be made without substantially deviating from the effects of the present disclosure.

For example, in the embodiments described with reference to FIGS. 1A to 24, the etching solution E in the processing tank 3 is replenished with the supplemental phosphoric acid from the outside of the processing tank 3. The etching solution E may however be supplied with the supplemental phosphoric acid inside the processing tank 3.

What is claimed is:

1. A substrate processing method performing an etching process on a substrate with an etching solution in a processing tank, the substrate including silicon oxide films and silicon nitride films stacked alternately, the etching solution containing phosphoric acid,
the substrate processing method including:
immersing the substrate in the etching solution and start etching; and
increasing silicon concentration of the etching solution from a first silicon concentration to a second silicon concentration that is higher than the first silicon concentration by replenishing the etching solution in the processing tank with phosphoric acid during the etching process on the substrate to cause the silicon concentration in the etching solution to increase first at a first rate, and then, before reaching the second silicon concentration, increasing a replenishment flow rate of the phosphoric acid to increase the silicon concentration at a second rate, the second rate being smaller than the first rate.

2. The substrate processing method according to claim 1, wherein in the replenishing,
the replenishment flow rate of the phosphoric acid that the etching solution is replenished with is controlled based on a set value for a replenishment flow rate of phosphoric acid that is set according to a structure of a semiconductor device to be manufactured using the substrate.

3. The substrate processing method according to claim 2, wherein the structure of the semiconductor device indicates size of a gap between the silicon oxide films adjacent to each other in a stacking direction in the semiconductor device.

4. The substrate processing method according to claim 1, wherein in the replenishing,
the replenishment flow rate of the phosphoric acid that the etching solution is replenished with is controlled based on the silicon concentration in the etching solution, the silicon concentration being measured during the etching process on the substrate.

5. The substrate processing method according to claim 1, wherein in the replenishing,
the phosphoric acid that the etching solution is replenished with is supplied with a silicon containing liquid, the silicon containing liquid being a liquid that contains silicon.

6. The substrate processing method according to claim 5, wherein in the replenishing,
a supply flow rate of the silicon containing liquid to be supplied to the phosphoric acid is controlled based on a set value for a supply flow rate of a silicon containing liquid that is set according to a structure of a semiconductor device to be manufactured using the substrate.

7. The substrate processing method according to claim 6, wherein the structure of the semiconductor device indicates size of a gap between the silicon oxide films adjacent to each other in a stacking direction in the semiconductor device.

8. The substrate processing method according to claim 5, wherein in the replenishing,
a supply flow rate of the silicon containing liquid to be supplied to the phosphoric acid is controlled based on the silicon concentration in the etching solution measured during the etching process on the substrate.

9. The substrate processing method according to claim 1, wherein in the replenishing,
the replenishment flow rate of the phosphoric acid that the etching solution is replenished with is controlled based on data stored in a storage and indicative of a predetermined silicon concentration variation such that the silicon concentration in the etching solution in the processing tank measured during the etching process on the substrate follows the predetermined silicon concentration variation.

10. The substrate processing method according to claim 9, wherein the data stored in the storage indicates a relationship between a processing time of the etching process and the silicon concentration.

11. The substrate processing method according to claim 9, wherein the data stored in the storage indicates a relationship between a processing time of the etching process and a varying rate of the silicon concentration.

12. The substrate processing method of claim 1, wherein the increasing the silicon concentration starts when etching starts.

* * * * *